US012745520B2

(12) United States Patent
Yang et al.

(10) Patent No.: US 12,745,520 B2
(45) Date of Patent: Sep. 22, 2026

(54) DISPLAY SUBSTRATE, PREPARING METHOD THEREFOR, AND DISPLAY APPARATUS

(71) Applicant: BOE Technology Group Co., Ltd., Beijing (CN)

(72) Inventors: Wei Yang, Beijing (CN); Ce Ning, Beijing (CN); Lizhong Wang, Beijing (CN); Yunping Di, Beijing (CN); Tianmin Zhou, Beijing (CN); Rui Huang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 631 days.

(21) Appl. No.: 18/022,172

(22) PCT Filed: May 31, 2022

(86) PCT No.: PCT/CN2022/096477

§ 371 (c)(1), (2) Date: Feb. 20, 2023

(87) PCT Pub. No.: WO2023/230922

PCT Pub. Date: Dec. 7, 2023

(65) Prior Publication Data

US 2024/0276767 A1 Aug. 15, 2024

(51) Int. Cl.

*H10K 59/131* (2023.01)
*H10K 59/12* (2023.01)
*H10K 59/121* (2023.01)

(52) U.S. Cl.

CPC ....... *H10K 59/131* (2023.02); *H10K 59/1201* (2023.02); *H10K 59/1213* (2023.02)

(58) Field of Classification Search

CPC .................................................... H10K 59/131

See application file for complete search history.

(56) References Cited

U.S. PATENT DOCUMENTS

2009/0002590 A1 1/2009 Kimura
2016/0293771 A1 10/2016 Long et al.
(Continued)

FOREIGN PATENT DOCUMENTS

CN 101335273 A 12/2008
CN 104253159 A * 12/2014 ....... H01L 21/02595
(Continued)

*Primary Examiner* — Lauren R Bell

(57) ABSTRACT

The present disclosure provides a display substrate, a preparing method therefor, and a display apparatus, the display substrate includes: a base substrate and a driving circuit layer arranged on the base substrate, the driving circuit layer further includes at least one first via hole, the first via hole is located between the second sub-electrode and the first active layer, an orthographic projection of the first via hole is overlapped with an orthographic projection of the first sub-electrode and an orthographic projection of the first active layer on the base substrate respectively, the first via hole exposes at least a portion of the first sub-electrode and at least a portion of the first active layer respectively, the second sub-electrode is electrically connected with the exposed first sub-electrode through the first via hole, and the second sub-electrode is electrically connected with the exposed first active layer through the first via hole.

8 Claims, 11 Drawing Sheets

(56) References Cited

U.S. PATENT DOCUMENTS

| | | | | |
|---|---|---|---|---|
| 2020/0357829 | A1 | 11/2020 | Yang et al. | |
| 2021/0328102 | A1* | 10/2021 | Park | H10K 59/124 |
| 2021/0376029 | A1* | 12/2021 | Yuan | H10K 59/126 |

FOREIGN PATENT DOCUMENTS

| | | | |
|---|---|---|---|
| CN | 108376672 | B | 12/2020 |
| CN | 215896392 | U | 2/2022 |
| CN | 215988758 | U | 3/2022 |
| KR | 10-2019-0065679 | A | 6/2019 |

* cited by examiner

DISPLAY SUBSTRATE, PREPARING METHOD THEREFOR, AND DISPLAY APPARATUS

CROSS-REFERENCE TO RELATED APPLICATION

The present application is a U.S. National Phase Entry of International Application No. PCT/CN2022/096477 having an international filing date of May 31, 2022. The above-identified application is hereby incorporated by reference.

TECHNICAL FIELD

The present disclosure relates to, but is not limited to, the field of display technology, and in particular to a display substrate, a preparing method therefor, and a display apparatus.

BACKGROUND

An Organic Light Emitting Diode (OLED) and a Quantum dot Light Emitting Diode (QLED) are active light emitting display devices and have advantages of self-illumination, a wide viewing angle, a high contrast ratio, low power consumption, an extremely high reaction speed, lightness and thinness, bendability, and a low cost, etc.

In recent years, Low Temperature Poly-Silicon Thin Film Transistor (LTPS TFT for short) and oxide thin film transistor have attracted much attention in the display industry, each of them has its own advantages, and they are equally matched. The low temperature poly silicon thin film transistor has advantages of a high mobility, fast charging, and the oxide thin film transistor has advantages of low leakage current, low power consumption.

SUMMARY

The following is a summary of subject matters described herein in detail. The summary is not intended to limit the protection scope of claims.

In one aspect, the present disclosure provides a display substrate, including a base substrate and a driving circuit layer arranged on the base substrate, wherein the driving circuit layer includes at least one pixel circuit, and the pixel circuit includes at least one first transistor;

the first transistor at least includes: a first active layer and a first source-drain electrode sequentially arranged on the base substrate, wherein the first source-drain electrode includes a first sub-electrode and a second sub-electrode, and the second sub-electrode is located at a side of the first sub-electrode away from the base substrate;

the driving circuit layer further includes at least one first via, the first via is located between the second sub-electrode and the first active layer, an orthographic projection of the first via is overlapped with an orthographic projection of the first sub-electrode and an orthographic projection of the first active layer on the base substrate respectively, the first via exposes at least a portion of the first sub-electrode and at least a portion of the first active layer respectively, the second sub-electrode is electrically connected with the exposed first sub-electrode through the first via, and the second sub-electrode is electrically connected with the exposed first active layer through the first via.

In an exemplary embodiment, the first sub-electrode includes a first part of the first sub-electrode and a second part of the first sub-electrode which are separated from each other, an orthographic projection of at least a portion of the first via on the base substrate is overlapped with an orthographic projection of the first part of the first sub-electrode and an orthographic projection of the second part of the first sub-electrode on the base substrate respectively, the first via exposes at least a portion of the first part of the first sub-electrode and at least a portion of the second part of the first sub-electrode respectively, and the second sub-electrode is electrically connected with the exposed first part of the first sub-electrode and the exposed second part of the first sub-electrode through the first via respectively.

In an exemplary embodiment, the first sub-electrode includes a first part of the first sub-electrode, a second part of the first sub-electrode, and a third part of the first sub-electrode connecting the first part of the first sub-electrode and the second part of the first sub-electrode;

the first part of the first sub-electrode and the second part of the first sub-electrode both extend along a first direction, and the third part of the first sub-electrode is bent along a second direction;

an orthographic projection of at least a portion of the first via on the base substrate is overlapped with an orthographic projection of the third part of the first sub-electrode on the base substrate, and the first via exposes at least a portion of the third part of the first sub-electrode;

the second sub-electrode is electrically connected with the exposed third part of the first sub-electrode through the first via, and the first direction is different from the second direction.

In an exemplary embodiment, a curved shape of the third part of the first sub-electrode may include one of a U shape, a circular arc shape, and a polygon shape.

In an exemplary embodiment, the first sub-electrode extends along the first direction, and the orthographic projection of the first sub-electrode on the base substrate is linear, an orthographic projection of at least a portion of the first via on the base substrate is overlapped with an orthographic projection of the first sub-electrode on the base substrate, the first via exposes at least a portion of the first sub-electrode, and the second sub-electrode is electrically connected with the exposed first sub-electrode through the first via.

In an exemplary embodiment, the first via includes a first via channel and a second via channel which are communicated with each other, and the first via channel is located on a side of the second via channel close to the base substrate;

an orthographic projection of the first via channel on the base substrate is overlapped with an orthographic projection of at least a portion of the second via channel on the base substrate, the orthographic projection of the first via channel on the base substrate is not overlapped with the orthographic projection of the first sub-electrode on the base substrate, the orthographic projection of the first via channel on the base substrate is overlapped with an orthographic projection of at least a portion of the first active layer on the base substrate, and at least a portion of the first active layer is exposed by the first via channel;

an orthographic projection of at least a portion of the second via channel on the base substrate is overlapped with an orthographic projection of at least a portion of the first sub-electrode on the base substrate, and at least a portion of the first sub-electrode is exposed by the second via channel;

at least a portion of the second sub-electrode is electrically connected with the exposed first active layer through the first via channel, and at least a portion of the second sub-electrode is electrically connected with the exposed first sub-electrode through the second via channel.

In an exemplary embodiment, the orthographic projection of the first via channel on the base substrate is located within an orthographic projection of the second via channel on the base substrate, and an area of the orthographic projection of the first via channel on the base substrate is smaller than an area of the orthographic projection of the second via channel on the base substrate.

In an exemplary embodiment, the first via includes a first via channel and a second via channel which are independent of each other, and the first via channel is located on a circumferential side of the second via channel;

an orthographic projection of the first via channel on the base substrate is overlapped with an orthographic projection of at least a portion of the first active layer on the base substrate, and at least a portion of the first active layer is exposed by the first via channel, the orthographic projection of the first via channel on the base substrate is not overlapped with the orthographic projection of the first sub-electrode on the base substrate;

an orthographic projection of the second via channel on the base substrate is overlapped with an orthographic projection of at least a portion of the first sub-electrode on the base substrate, and at least a portion of the first sub-electrode is exposed by the second via channel;

the second sub-electrode is electrically connected with the exposed first active layer through the first via channel, and the second sub-electrode is electrically connected with the exposed first sub-electrode through the second via channel.

In an exemplary embodiment, the orthographic projection of the second via channel on the base substrate is overlapped with an orthographic projection of at least a portion of the first active layer and an orthographic projection of at least a portion of the first sub-electrode on the base substrate, and the second via channel exposes at least a portion of the first active layer and at least a portion of the first sub-electrode, and at least a portion of the second sub-electrode is electrically connected with the exposed first active layer and the exposed first sub-electrode through the second via channel respectively.

In an exemplary embodiment, the second via channel includes a first sub-via channel and a second sub-via channel which are communicated with each other, and the first sub-via channel is located on a side of the second sub-via channel close to the base substrate;

an orthographic projection of the first sub-via channel on the base substrate is overlapped with an orthographic projection of at least a portion of the second sub-via channel on the base substrate, an orthographic projection of the first sub-via channel on the base substrate is not overlapped with the orthographic projection of the first sub-electrode, an orthographic projection of the first sub-via channel on the base substrate is overlapped with an orthographic projection of at least a portion of the first active layer on the base substrate, and at least a portion of the first active layer is exposed by the first sub-via channel;

an orthographic projection of at least a portion of the second sub-via channel on the base substrate is overlapped with an orthographic projection of at least a portion of the first sub-electrode on the base substrate, and at least a portion of the first sub-electrode is exposed by the second sub-via channel;

the second sub-electrode is electrically connected with the exposed first active layer through the first sub-via channel, and at least a portion of the second sub-electrode is electrically connected with the exposed first sub-electrode through the second sub-via channel.

In an exemplary embodiment, the orthographic projection of the first sub-via channel on the base substrate is located within an orthographic projection of the second sub-via channel on the base substrate, and an area of the orthographic projection of the first sub-via channel on the base substrate is smaller than an area of the orthographic projection of the second sub-via channel on the base substrate.

In an exemplary embodiment, the first sub-electrode includes a first part of the first sub-electrode, a second part of the first sub-electrode, and a third part of the first sub-electrode connecting the first part of the first sub-electrode and the second part of the first sub-electrode, and the first part of the first sub-electrode, the second part of the first sub-electrode, and the third part of the first sub-electrode all extends in the first direction;

the orthographic projection of the first via on the base substrate is overlapped with an orthographic projection of at least a portion of the third part of the first sub-electrode on the base substrate, and the first via exposes at least a portion of the third part of the first sub-electrode;

the second sub-electrode is electrically connected with the exposed third part of the first sub-electrode through the first via;

the third part of the first sub-electrode has a first edge and a second edge arranged opposite to each other in the second direction, the first part of the first sub-electrode has a third edge and a fourth edge arranged opposite to each other in the second direction, the second part of the first sub-electrode has a fifth edge and a sixth edge arranged opposite to each other in the second direction, a distance from the first edge to the second edge is greater than a distance from the third edge to the fourth edge; and/or, the distance from the first edge to the second edge is greater than a distance from the fifth edge to the sixth edge.

In an exemplary embodiment, the driving circuit layer further includes a second gate insulating layer, a second interlayer dielectric layer and a third interlayer dielectric layer sequentially arranged on the base substrate, the second gate insulating layer and the second interlayer dielectric layer are located between the first active layer and the first sub-electrode, the third interlayer dielectric layer is located on a side of the first sub-electrode away from the base substrate, and the first via passes through the third interlayer dielectric layer, the second interlayer dielectric layer and the second gate insulating layer sequentially from a surface of the third interlayer dielectric layer away from the base substrate, and extends to a surface of the first active layer on a side away from the substrate.

In an exemplary embodiment, the first transistor further includes a second source-drain electrode, the second source-drain electrode is located on a side of the first active layer away from the base substrate, the driving circuit layer further includes a second via, and the second source-drain electrode is electrically connected with the first active layer through the second via.

In an exemplary embodiment, the second sub-electrode and the second source-drain electrode are arranged in a same layer.

In an exemplary embodiment, the first transistor further includes a first gate and a second gate, the first gate is located on a side of the first active layer close to the base substrate, the second gate is located on a side of the first active layer away from the base substrate, and an orthographic projection of the first gate, an orthographic projection of the second gate and the orthographic projection of the first active layer are overlapped on the base substrate.

In an exemplary embodiment, a material of the first active layer includes one of an indium gallium zinc oxide material and an indium tin zinc oxide material.

In an exemplary embodiment, the pixel circuit includes at least one second transistor; the second transistor includes a second active layer, a third gate, a third source-drain electrode and a fourth source-drain electrode sequentially arranged on the base substrate, an orthographic projection of the second active layer is overlapped with an orthographic projection of the third gate on the base substrate, the third source-drain electrode and the fourth source-drain electrode are electrically connected with the second active layer, and a material of the second active layer includes low-temperature polysilicon.

In another aspect, the present disclosure further provides a display apparatus, including the aforementioned display substrate.

In a further aspect, the present disclosure further provides a preparing method for a display substrate, including:

forming a first active layer on the base substrate;

forming a first sub-electrode on the first active layer;

forming a first via on the base substrate, allowing the first via to expose at least a portion of the first sub-electrode and at least a portion of the first active layer respectively;

forming a second sub-electrode on the first sub-electrode, allowing the second sub-electrode to be electrically connected with the exposed first sub-electrode through the first via, and the second sub-electrode to be electrically connected with the exposed first active layer through the first via.

In an exemplary embodiment, forming the first sub-electrode on the first active layer includes:

forming a first conductive layer on the first active layer;

patterning the first conductive layer, allowing the first conductive layer to form a first part of the first sub-electrode and a second part of the first sub-electrode which are separated from each other;

allowing at least a portion of the first part of the first sub-electrode and at least a portion of the second part of the first sub-electrode to be respectively exposed by the first via, and the second sub-electrode to be electrically connected with the exposed first part of the first sub-electrode and the exposed second part of the first sub-electrode through the first via.

In an exemplary embodiment, forming the first sub-electrode on the first active layer includes:

forming a first conductive layer on the first active layer;

patterning the first conductive layer, allowing the first conductive layer to form a first part of the first sub-electrode, a second part of the first sub-electrode, and a third part of the first sub-electrode connecting the first part of the first sub-electrode and the second part of the first sub-electrode, the first part of the first sub-electrode and the second part of the first sub-electrode extends in the first direction, and the third part of the first sub-electrode bends in the second direction;

allowing at least a portion of the third part of the first sub-electrode to be exposed by the first via, and the second sub-electrode is electrically connected with the exposed third part of the first sub-electrode through the first via, wherein, the first direction is different from the second direction.

In an exemplary embodiment, forming the first sub-electrode on the first active layer includes:

forming a first conductive layer on the first active layer;

patterning the first conductive layer, allowing the first conductive layer to form a first sub-electrode, and allowing the orthographic projection of the first sub-electrode on the base substrate to be linear;

allowing the first via to expose at least a portion of the first sub-electrode, and the second sub-electrode to be electrically connected with the exposed first sub-electrode through the first via.

In an exemplary embodiment, forming the first via on the base substrate includes:

forming a first via channel and a second via channel which are independent of each other on the base substrate;

the first via channel exposes at least a portion of the first active layer, and an orthographic projection of the first via channel on the base substrate to be not overlapped with the orthographic projection of the first sub-electrode on the base substrate;

allowing the second via channel to expose at least a portion of the first sub-electrode;

allowing the second sub-electrode to be electrically connected with the exposed first active layer through the first via channel, and allowing the second sub-electrode to be electrically connected with the exposed first sub-electrode through the second via channel.

In an exemplary embodiment, forming the second via channel on the base substrate includes:

forming a first sub-via channel on the base substrate, allowing the first sub-via channel to expose at least a portion of the first sub-electrode, and allowing an orthographic projection of the first sub-via channel on the base substrate to be not overlapped with the orthographic projection of the first sub-electrode on the base substrate;

forming a second sub-via channel at a side of the first sub-via channel away from the base substrate, allowing the second sub-via channel to be communicated with the first sub-via channel;

allowing the second sub-electrode to be electrically connected with the exposed first active layer through the first sub-via channel, and the second sub-electrode to be electrically connected with the exposed first sub-electrode through the second sub-via channel.

In an exemplary embodiment, forming the first sub-electrode on the first active layer includes:

forming a first conductive layer on the first active layer;

patterning the first conductive layer, allowing the first conductive layer to form a first part of the first sub-electrode, a second part of the first sub-electrode, and a third part of the first sub-electrode connecting the first part of the first sub-electrode and the second part of the first sub-electrode, and the first part of the first sub-electrode, the second part of the first sub-electrode, and the third part of the first sub-electrode extends in the first direction;

the third part of the first sub-electrode has a first edge and a second edge arranged opposite to each other in the second direction, the first part of the first sub-electrode has a third edge and a fourth edge arranged opposite to each other in the second direction, and the second part of the first sub-electrode has a fifth edge and a sixth edge arranged opposite to each other in the second direction, allowing a distance from the first edge to the second edge to be greater than a distance from the third edge to the fourth edge; and/or allowing the distance from the first edge to the second edge to be greater than a distance from the fifth edge to the sixth edge;

allowing at least a portion of the third part of the first sub-electrode to be exposed by the first via, and the second sub-electrode to be electrically connected with the exposed third part of the first sub-electrode through the first via.

Other aspects will become apparent upon reading and understanding the accompanying drawings and the detailed description.

BRIEF DESCRIPTION OF DRAWINGS

Accompanying drawings are used for providing an understanding for technical solutions of the present application and form a part of the specification, and are used for explaining the technical solutions of the present application together with embodiments of the present application, and do not constitute a limitation on the technical solutions of the present application.

DETAILED DESCRIPTION

Figure 1:
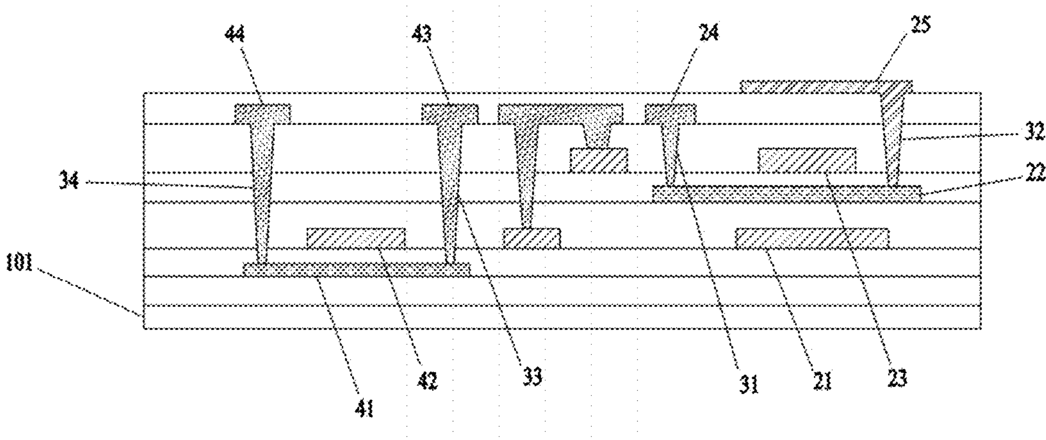
FIG. 1 is a cross-sectional view of a display substrate in a related art.

To make objectives, technical solutions, and advantages of the present disclosure clearer, the embodiments of the present disclosure will be described in detail with reference to the accompanying drawings. It is to be noted that implementations may be implemented in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

In the drawings, a size of each constituent element, a thickness of a layer, or a region is exaggerated sometimes for clarity. Therefore, one implementation mode of the present disclosure is not necessarily limited to the sizes, and shapes and sizes of various components in the drawings do not reflect actual scales. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulation layer" sometimes.

In the present disclosure, "about" refers to that a boundary is defined not so strictly and numerical values within process and measurement error ranges are allowed.

FIG. 1 is a cross-sectional view of a display substrate in a related art. As shown in FIG. 1, the display substrate of the related art includes a base substrate 101 and a driving circuit layer arranged on the base substrate 101, and the driving circuit layer includes at least one pixel circuit and at least one gate driving circuit.

The pixel circuit includes at least one first transistor; the first transistor at least includes a first gate 21, a first active layer 22, a second gate 23, a first source-drain electrode 24 and a second source-drain electrode 25 sequentially arranged on the base substrate 101; the first gate 21 is located on a side of the first active layer 22 close to the base substrate 101, and the second gate 23 is located on a side of the first active layer 22 away from the base substrate 101, and an orthographic projection of the first gate 21, an orthographic projection of the second gate 23, and an orthographic projection of the first active layer 22 are overlapped on the base substrate 101.

The driving circuit layer further includes at least one first via 31 and at least one second via 32. Both an orthographic projection of the first via 31 and an orthographic projection of the second via 32 are overlapped with the orthographic projection of the first active layer 22 on the base substrate 101. The first via 31 is located between the first source-drain electrode 24 and the first active layer 22, the first via 31 exposes at least a portion of the first active layer 22, and the first source-drain electrode 24 is electrically connected with the exposed first active layer 22 through the first via 31. The second via 32 is located between the second source-drain electrode 25 and the first active layer 22, the second via 32 exposes at least a portion of the first active layer 22, and the second source-drain electrode 25 is electrically connected with the exposed first active layer 22 through the second via 32.

The gate driving circuit includes at least one second transistor; the second transistor at least includes a second active layer 41, a third gate 42, a third source-drain electrode 43 and a fourth source-drain electrode 44 sequentially arranged on the base substrate 101, the third gate 42 is located on a side of the second active layer 41 away from the base substrate 101, and an orthographic projection of the third gate 42 is overlapped with an orthographic projection of the second active layer 41 on the base substrate 101.

The driving circuit layer further includes at least one third via 33 and at least one fourth via 34. Both an orthographic projection of the third via 33 and an orthographic projection of the fourth via 34 are overlapped with the orthographic projection of the second active layer 41 on the base substrate 101. The third via hole 33 is located between the third source-drain electrode 43 and the second active layer 41, the third via 33 exposes at least a portion of the second active layer 41, and the third source-drain electrode 43 is electrically connected with the exposed second active layer 41 through the third via 33. The fourth via 34 is located between the fourth source-drain electrode 44 and the second active layer 41, the fourth via 34 exposes at least a portion of the second active layer 41, and the fourth source-drain electrode 44 is electrically connected with the exposed second active layer 41 through the fourth via 34.

The first transistor in the display substrate of a related art may be an oxide thin film transistor, and the oxide thin film transistor has the advantage of a low leakage current; the second transistor may be a Low Temperature Poly-Silicon Thin Film Transistor (LTPS TFT for short), low temperature polysilicon thin film transistor has the advantages of a high mobility and fast charging.

Figure 2:
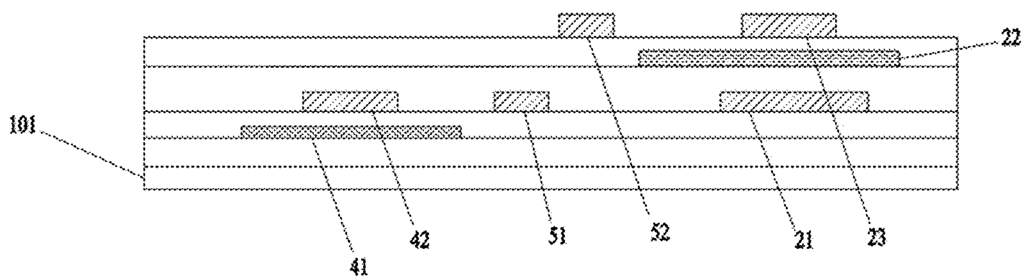
FIG. 2 is a schematic diagram of a display substrate obtained after a first semiconductor layer, a first conductive layer, a second semiconductor layer and a second conductive layer are formed in a related art.

FIG. 1 to FIG. 6 are schematic diagrams of a preparing process of a related display substrate. The preparing process of the display substrate of the related art includes:

(1) A first semiconductor layer, a first conductive layer, a second semiconductor layer and a second conductive layer are sequentially formed on the base substrate 101; wherein the first semiconductor layer includes a second active layer 41, the first conductive layer includes a third gate 42, a first gate 21, and a first connection electrode 51, the second semiconductor layer includes a first active layer 22, and the second conductive layer includes a second gate 23 and a second connection electrode 52, the first connection electrode is electrically connected with the first gate 21, the second connection electrode is electrically connected with the second gate 23, as shown in FIG. 2.

Figure 3:
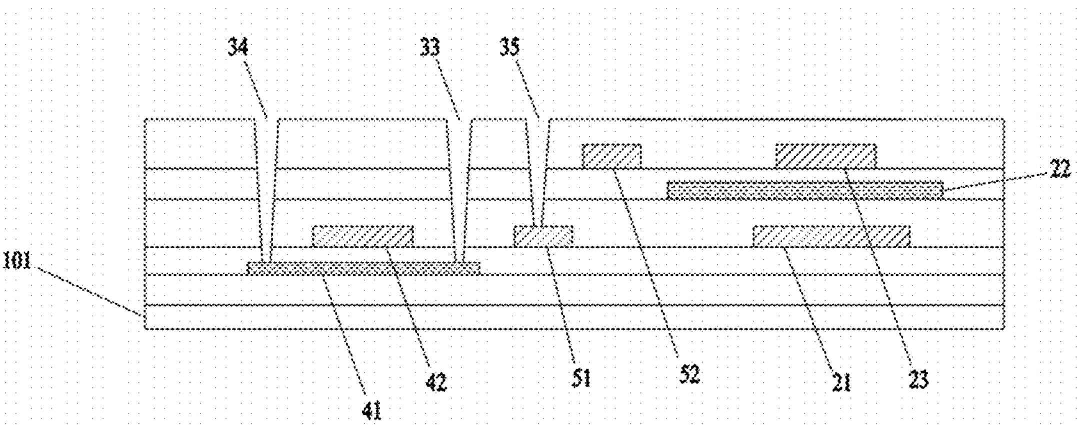
FIG. 3 is a schematic diagram of a display substrate obtained after a third via, a fourth via and a fifth via are formed in a related art.

(2) Forming a third via 33, a fourth via 34, and a fifth via 35 on the base substrate 101 on which the aforementioned pattern is formed through a first etching process, so that at least a portion of the second active layer 41 is exposed by the third via 33, at least a portion of the second active layer 41 is exposed by the fourth via 34, and at least a portion of the first connection electrode 51 is exposed by the fifth via 35; the oxide layer on the surface of the exposed second active layer 41 is then removed by a patterning process (e.g., etching) to improve the contact resistance between the second active layer 41 and the subsequent third source-drain electrode 43 and fourth source-drain electrode 44, as shown in FIG. 3.

Figure 4:
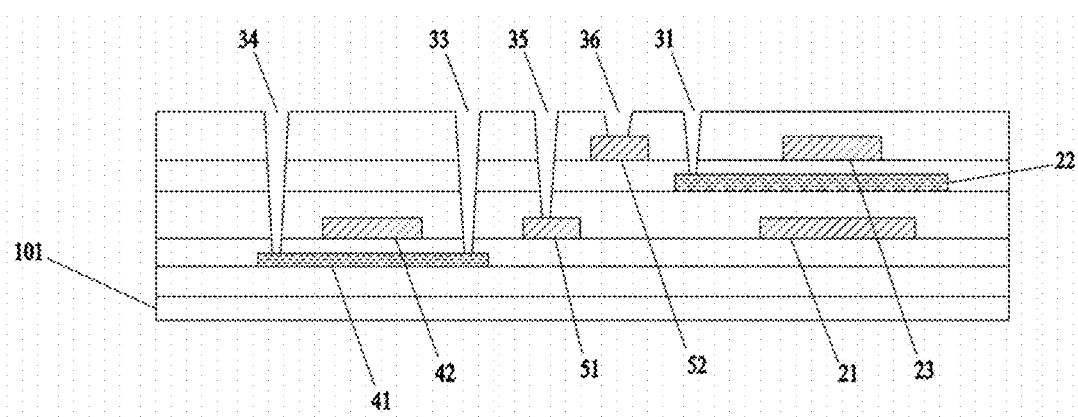
FIG. 4 is a schematic diagram of a display substrate obtained after a first via and a sixth via are formed in a related art.

(3) Forming a first via 31 and a sixth via 36 on the base substrate 101 on which the aforementioned pattern is formed through a second etching process, so that at least a portion of the first active layer 22 is exposed by the first via 33, and at least a portion of the second connection electrode 52 is exposed by the sixth via 36, as shown in FIG. 4.

Figure 5:
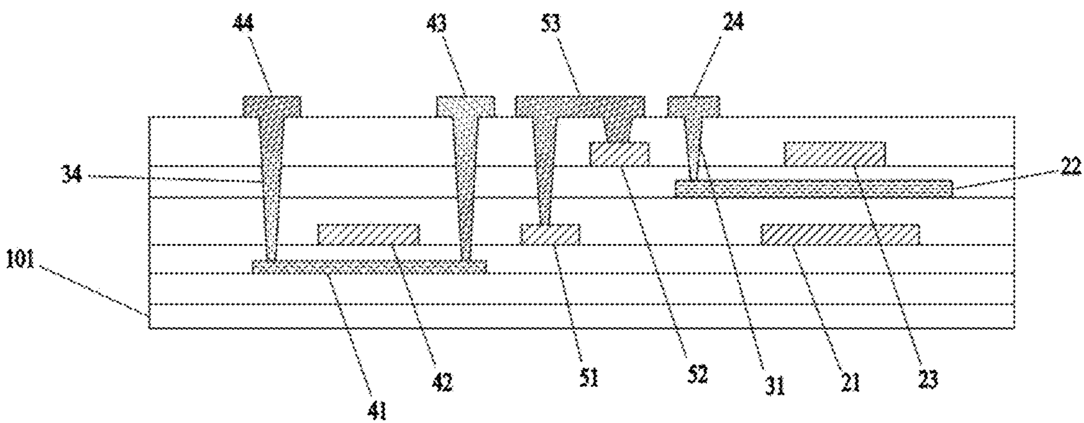
FIG. 5 is a schematic diagram of a display substrate obtained after a third conductive layer is formed in a related art.

(4) Forming a third conductive layer on the base substrate 101 on which the aforementioned pattern is formed on a side of the second conductive layer away from the base substrate 101; wherein, the third conductive layer includes a first source-drain electrode 24, a third source-drain electrode 43, a fourth source-drain electrode 44 and a third connection electrode 53, the first source-drain electrode 24 is electrically connected with the exposed first active layer 22 through a first via 31, the third source-drain electrode 43 is electrically connected with the exposed second active layer 41 through a third via 33, the fourth source-drain electrode 44 is electrically connected with the exposed second active layer 41 through a fourth via 34, the third connection electrode 53 is electrically connected with the exposed second connection electrode 52 through the sixth via 36, so that a portion of the third connection electrode 53 is electrically connected with the first gate 21 through the first connection electrode 51, and so that a portion of the third connection electrode 53 is electrically connected with the second gate 23 through the second connection electrode 52, thereby achieving electrical connection between the first gate 21 and the second gate 23, as shown in FIG. 5.

Figure 6:
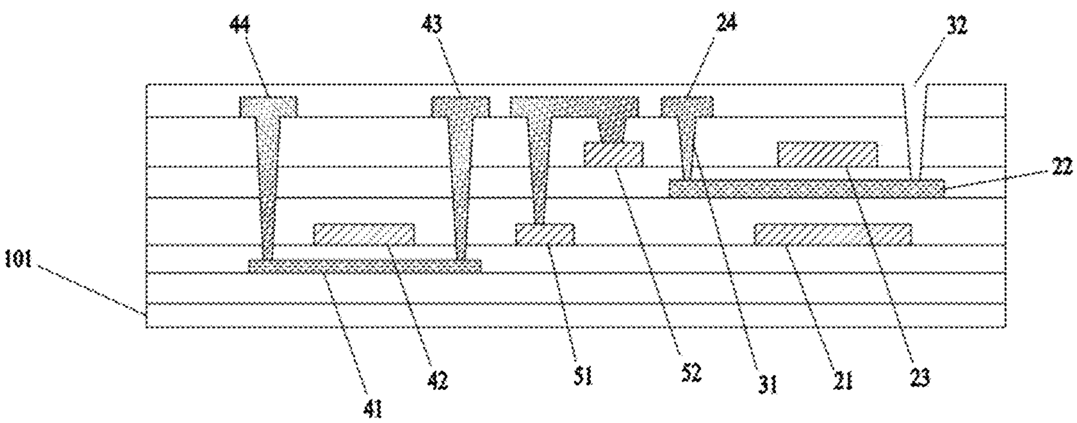
FIG. 6 is a schematic diagram of a display substrate obtained after a second via is formed in a related art.

(5) Forming a second via 32 on the base substrate 101 on which the aforementioned pattern is formed through a third etching process, so that at least a portion of the first active layer 22 is exposed by the second via 32, as shown in FIG. 6.

(6) Forming a fourth conductive layer on the base substrate 101 on which the aforementioned pattern is formed on a side of the third conductive layer away from the base substrate 101; wherein the fourth conductive layer includes a second source-drain electrode 25 electrically connected with the exposed first active layer 22 through a second via 32, as shown in FIG. 1.

Figure 7:
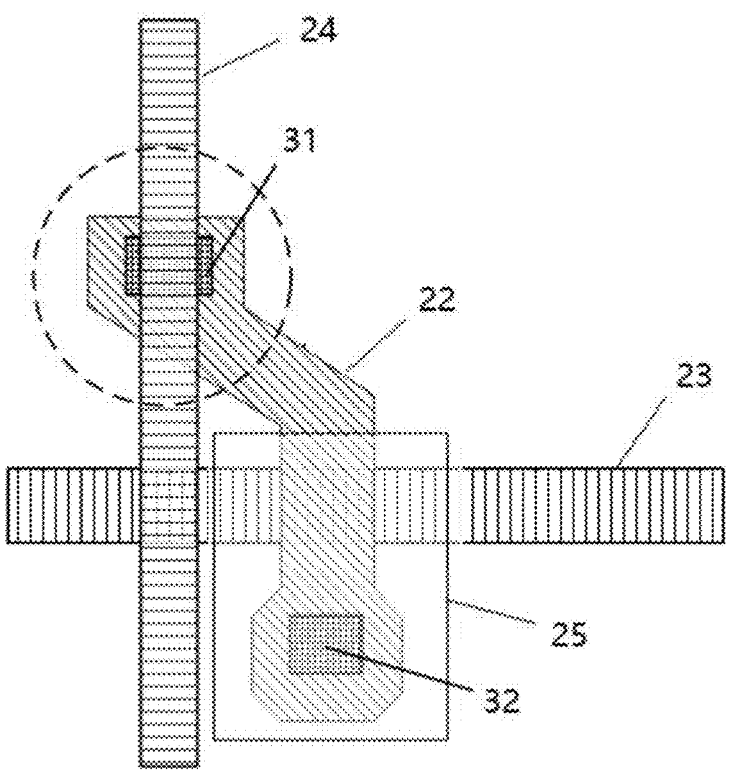
FIG. 7 is a top view of a first via and a second via in a related display substrate.

FIG. 7 is a top view of the first via and the second via in a related display substrate. As shown in FIG. 7, the orthographic projection of the first via 31 on the base substrate and the orthographic projection of the second via 32 on the base substrate do not overlap, the first source-drain electrode 24 is electrically connected with the exposed first active layer 22 through the first via 31, and the second source-drain electrode 25 is electrically connected with the exposed first active layer 22 through the second via 32.

A third via 33 and a fourth via 34 are formed by a first etching process in the preparing process of a related display substrate, at least a portion of the second active layer 41 is exposed by both the third via 33 and the fourth via 34, and the oxide layer on the surface of the exposed second active layer 41 is removed by a patterning process, and then the first via 31 is formed by a second etching process, so that the first via 31, the third via 33, the fourth via 34, the fifth via 35 and the sixth via 36 cannot be formed by a same etching process.

The reason why the first via hole 31, the third via hole 33, the fourth via hole 34, the fifth via hole 35, and the sixth via hole 36 cannot be formed simultaneously in the related display substrate is that: in the first aspect, after forming the third via 33 and the fourth via 34, the oxide layer on the surface of the exposed second active layer 41 needs to be removed by a patterning process; if the first via 31, the third via 33, the fourth via 34, the fifth via 35 and the sixth via 36 are formed by a same etching process, then the first active layer 22 exposed by the first via 31 will be etched when the oxide layer on the surface of the second active layer 41 is removed; in the second aspect, if the first via 31, the third via 33, the fourth via 34, the fifth via 35 and the sixth via 36 are formed by the same etching process, because a distance between an upper surface of the first connection electrode 51 and a lower surface of the third connection electrode 53 is much larger than a distance between an upper surface of the second connection electrode 52 and a lower surface of the third connection electrode 53, the second connection electrode 52 is easily subjected to over-cutting for a long time, and the second connection electrode 52 is at risk of being cut through.

It can be seen from the preparing process of the aforementioned related display substrate that the preparing process of the related display substrate is complex and has many processes, which increases the production cost.

The embodiment of the present disclosure provides a display substrate, including a base substrate and a driving circuit layer arranged on the base substrate, wherein the driving circuit layer includes at least one pixel circuit, the pixel circuit includes at least one first transistor;

the first transistor at least includes: a first active layer and a first source-drain electrode sequentially arranged on the substrate, wherein the first source-drain electrode includes a first sub-electrode and a second sub-electrode, and the second sub-electrode is located at a side of the first sub-electrode away from the base substrate;

The driving circuit layer further includes a first via located between the second sub-electrode and the first active layer, an orthographic projection of the first via is overlapped with an orthographic projection of the first sub-electrode and an orthographic projection of the first active layer respectively on the base substrate, the first via exposes at least a portion of the first sub-electrode and at least a portion of the first active layer respectively, the second sub-electrode is electrically connected with the exposed first sub-electrode through the first via, and the second sub-electrode is electrically connected with the exposed first active layer through the first via.

Embodiments of the present disclosure show that the display substrate exposes the first sub-electrode and the first active layer through the first via, the second sub-electrode is electrically connected with the first sub-electrode and the first active layer respectively through the first via, so that the first via may be formed by a same preparing process as other vias of the display substrate, for example, the first via may be formed by a same preparing process as the second via, so that the preparing step of forming the first via may be omitted, the preparing process of the display substrate can be simplified, and the production cost can be reduced.

Figure 8:
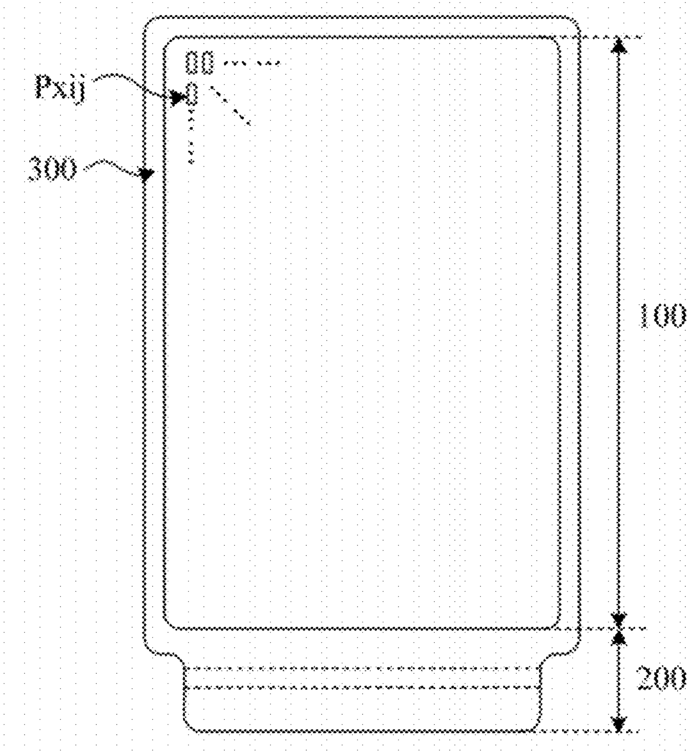
FIG. 8 is a schematic diagram of a structure of a display substrate according to an embodiment of the present disclosure.

FIG. 8 is a schematic diagram of a structure of a display substrate according to an embodiment of the present disclosure. As shown in FIG. 8, the display substrate may include a display region 100, a bonding region 200 located at a side of the display region 100, and a bezel region 300 located at other sides of the display region 100 according to an embodiment of the present disclosure. In some examples, the display region 100 may be a planar region including a plurality of sub-pixels Pxij that form a pixel array, the plurality of sub-pixels Pxij may be configured to display a dynamic picture or a static image, and the display region 100 may be referred to as an active area (AA). In some examples, the display substrate may be a flexible substrate, and accordingly the display substrate can be deformed, for example, can be crimped, bent, folded, or curled.

In an exemplary embodiment, a bonding region 200 may include a fan-out region, a bending region, a driver chip region, and a bonding pin region that are sequentially arranged along a direction away from the display region 100. The fan-out region is connected with the display region 100 and at least includes a data fan-out line. A plurality of data fan-out lines are configured to be connected with the data signal lines of the display region 100 in a fan-out routing manner. The bending region is connected with the fan-out region and may include a composite insulating layer provided with a groove, and is configured to bend the driver chip region and the bonding pin region to the back of the display region 100. The driver chip region may be provided with an Integrated Circuit (IC for short) and the IC may be configured to be connected with a plurality of data fan-out lines. The bonding pin region may include a Bonding Pad, and the bonding pad may be configured to be bonded to an external Flexible Printed Circuit (FPC for short).

In some exemplary implementations, the display region may include a plurality of pixel units arranged in a matrix. For example, at least one pixel unit P may include a first sub-pixel P1 emitting first-color light, a second sub-pixel P2 emitting second-color light, and a third sub-pixel P3 and a fourth sub-pixel P4 emitting third-color light. Each sub-pixel may include a pixel circuit and a light emitting element, wherein the pixel circuit is electrically connected with a scan signal line, a data signal line, and a light emitting controlling line respectively. The pixel circuit may be configured to receive a data voltage transmitted by the data signal line under control of the scan signal line and the light emitting controlling line, and output a corresponding current to the light emitting element. The light emitting element in each sub-pixel is connected with a pixel circuit of a sub-pixel where the light emitting element is located, and the light emitting element is configured to emit light with a corresponding brightness in response to a current output by the pixel circuit of the sub-pixel where the light emitting element is located.

In an exemplary embodiment, the first sub-pixel may be a red sub-pixel (R) emitting red light, the second sub-pixel may be a blue sub-pixel (B) emitting blue light, and the third sub-pixel and the fourth sub-pixel may be green sub-pixels (G) emitting green light. In some examples, the shape of the light emitting element of the sub-pixel may be rectangle, diamond, pentagonal, hexagonal. The light emitting elements of the four sub-pixels may be arranged in a manner of diamond to form an RGBG pixel arrangement. In other exemplary embodiments, the light emitting elements of the four sub-pixels may be arranged side by side horizontally, side by side vertically, or in a square-shaped manner, which is not limited in the present disclosure. In some other exemplary embodiments, the pixel unit may include three sub-pixels, the light emitting elements of the three sub-pixels may be arranged side by side horizontally, side by side vertically, in a shape of delta, or the like, which is not limited in the present disclosure.

Figure 9:
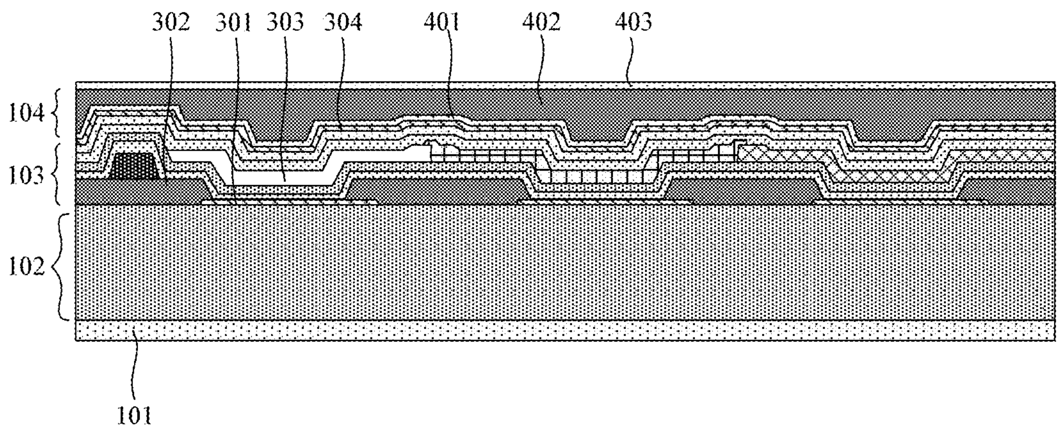
FIG. 9 is a schematic diagram of a cross-sectional structure of a display region of a display substrate according to an embodiment of the present disclosure.

FIG. 9 is a schematic diagram of a cross sectional structure of a display region of a display substrate according to an embodiment of the present disclosure. FIG. 9 illustrates structures of three sub-pixels in the display region 100. As shown in FIG. 9, in a direction perpendicular to the display substrate, the display substrate may include a base substrate 101, and a driving circuit layer 102, a light emitting structure layer 103 and an encapsulation structure layer 104 which are sequentially arranged on the base substrate 101. In some possible implementations, the display substrate may include other film layers, such as a touch structure layer, which is not limited here in the present disclosure.

In an exemplary embodiment, the base substrate 101 may be a flexible base substrate, or may be a rigid base substrate. The drive circuit layer 102 of each sub-pixel may include a pixel circuit formed by a plurality of transistors and capacitors. The emitting structure layer 103 of each sub-pixel may at least include an anode 301, a pixel define layer 302, an organic emitting layer 303 and a cathode 304. The anode 301 is connected with the pixel circuit, the organic emitting layer 303 is connected with the anode 301, the cathode 304 is connected with the organic emitting layer 303, and the organic emitting layer 303 emits light of a corresponding color under driving of the anode 301 and the cathode 304. The encapsulation structure layer 104 may include a first encapsulation layer 401, a second encapsulation layer 402, and a third encapsulation layer 403 that are stacked, the first encapsulation layer 401 and the third encapsulation layer 403 may be made of an inorganic material, the second encapsulation layer 402 may be made of an organic material, and the second encapsulation layer 402 is arranged between the first encapsulation layer 401 and the third encapsulation layer 403 to form an inorganic material/organic material/inorganic material laminated structure and ensure that external water vapor cannot enter the light emitting structure layer 103.

In an exemplary embodiment, the organic light emitting layer 303 may include an emitting layer (EML), and any one or more of following layers: a hole injection layer (HIL), a hole transport layer (HTL), an electron block layer (EBL), a hole block layer (HBL), an electron transport layer (ETL), and an electron injection layer (EIL). In some examples, one or more layers of hole injection layers, hole transport layers, electron block layers, hole block layers, electron transport layers, and electron injection layers of all sub-pixels may be a common layer communicated together. Emitting layers of adjacent sub-pixels may be overlapped slightly, or may be mutually isolated.

The display substrate of the present embodiment will now be described with some examples.

Figure 10A:
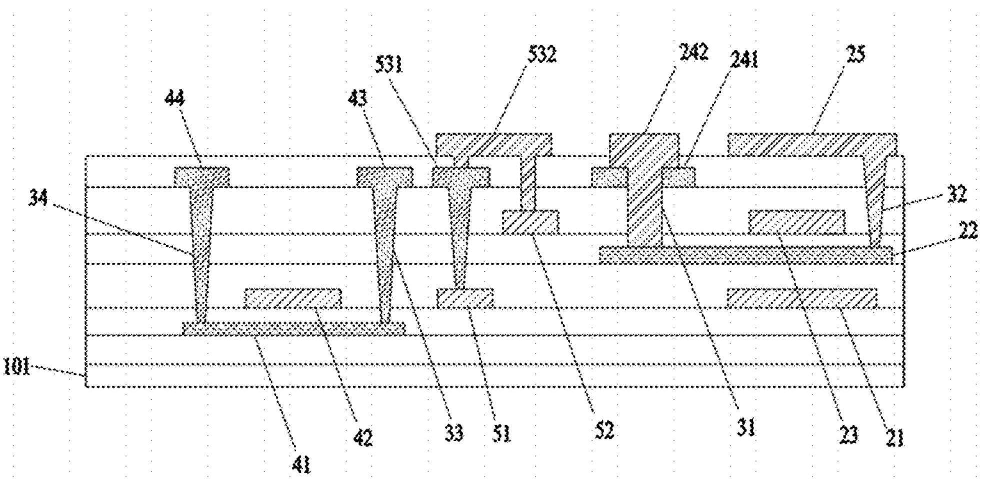
FIG. 10A is a first cross-sectional view of a display substrate according to an embodiment of the present disclosure.

FIG. 10A is a first cross-sectional view of a display substrate according to an embodiment of the present disclosure. In an exemplary embodiment, as shown in FIG. 10A, the drive circuit layer of the display substrate of an embodiment of the present disclosure may include at least one pixel circuit and at least one gate drive circuit in a direction parallel to the display substrate.

In an exemplary embodiment, the pixel circuit includes at least one first transistor in a direction perpendicular to the display substrate; the first transistor at least includes a first gate 21, a first active layer 22, a second gate 23, a first source-drain electrode and a second source-drain electrode 25 sequentially arranged on the base substrate 101; the first gate 21 is located on a side of the first active layer 22 close to the base substrate 101, and the second gate 23 is located on a side of the first active layer 22 away from the base substrate 101, and an orthographic projection of the first gate 21 and an orthographic projection of the second gate 23 are overlapped with an orthographic projection of the first active layer 22 on the base substrate 101.

In an exemplary embodiment, the first source-drain electrode includes a first sub-electrode 241 and a second sub-electrode 242, and the second sub-electrode 242 located on a side of the first sub-electrode 241 away from the base substrate 101. Wherein, the first source-drain electrode may be used as a drain electrode of the first transistor.

In an exemplary embodiment, the second sub-electrode 242 and the second source-drain electrode 25 may be arranged in a same layer and prepared by a same preparing process using a same material, thereby simplifying the process and reducing the production cost.

In an exemplary embodiment, the drive circuit layer further includes at least one first via 31 and at least one second via 32.

In an exemplary embodiment, the first via 31 is located between the second sub-electrode 242 and the first active layer 22, an orthographic projection of the first via 31 is overlapped with the orthographic projection of the first sub-electrode 241 and the orthographic projection of the first active layer 22 on the base substrate 101, respectively, and the first via 31 exposes at least a portion of the first sub-electrode 241 and at least a portion of the first active layer 22. An orthographic projection of the second sub-electrode 242 is overlapped with the orthographic projection of the first via 31 on the base substrate 101, and at least a portion of the second sub-electrode 242 is electrically connected with the exposed first sub-electrode 241 through the first via 31, and at least a portion of the second sub-electrode 242 is electrically connected with the exposed first active layer 22 through the first via 31.

Figure 11:
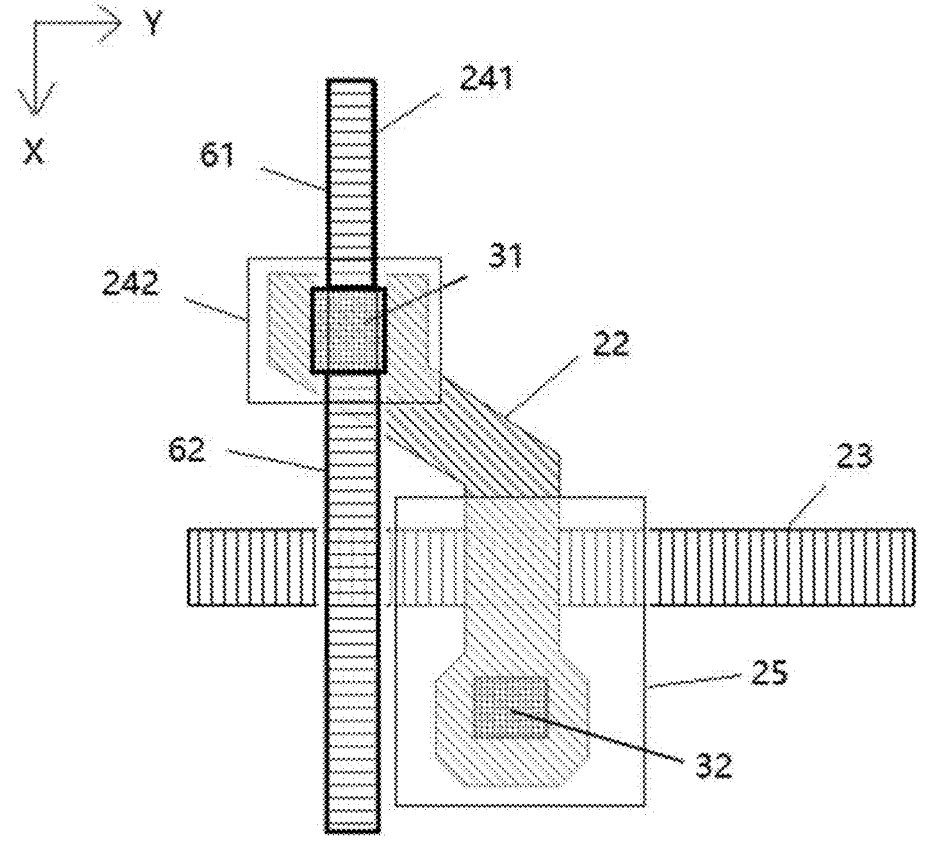
FIG. 11 is a first top view of a first crystal in a display substrate according to an embodiment of the present disclosure.

FIG. 11 is a first top view of a first crystal in a display substrate according to an embodiment of the present disclosure. In an exemplary embodiment, as shown in FIG. 10A and FIG. 11, the first sub-electrode 241 includes a first part of the first sub-electrode 61 and a second part of the first sub-electrode 62 separated from each other, both the first part of the first sub-electrode 61 and the second part of the first sub-electrode 62 extend along a first direction X, and both an orthographic projection of the first part of the first sub-electrode 61 and an orthographic projection of the second part of the first sub-electrode 62 are linear on the base substrate. The first part of the first sub-electrode 61 and the second part of the first sub-electrode 62 are located on two sides of the first via 31 in the first direction X.

In an exemplary embodiment, the first part of the first sub-electrode 61 and the second part of the first sub-electrode 62 may be arranged in a same layer and prepared by a same preparing process using a same material, thereby simplifying the process and reducing the production cost.

In an exemplary embodiment, as shown in FIG. 10A and FIG. 11, an orthographic projection of at least a portion of the first via 31 on the base substrate 101 is overlapped with an orthographic projection of the first part of the first sub-electrode 61 and an orthographic projection of the second part of the first sub-electrode 62 on the base substrate 101 respectively, and the first via 31 exposes at least a portion of the first part of the first sub-electrode 61 and at least a portion of the second part of the first sub-electrode, respectively. At least a portion of the second sub-electrode 242 is electrically connected with the exposed first part of the first sub-electrode 61 through the first via 31, and at least a portion of the second sub-electrode 242 is electrically connected with the exposed second part of the first sub-electrode 62 through the first via 31, so that the second sub-electrode 242 is electrically connected with the exposed first sub-electrode 241 through the first via 31.

Figure 10B:
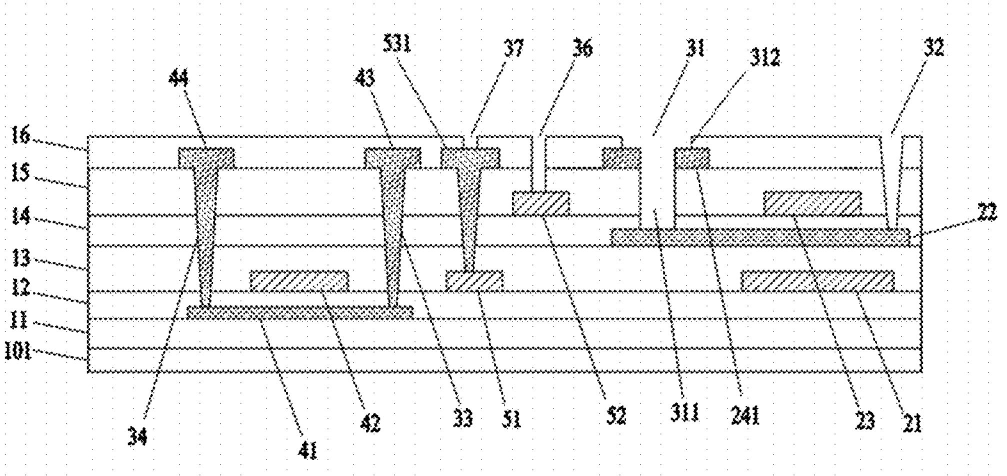
FIG. 10B is a schematic diagram of a display substrate obtained after a first via is formed according to an embodiment of the present disclosure.

FIG. 10B is a schematic diagram of a display substrate obtained after a first via is formed according to an embodiment of the present disclosure. In an exemplary embodiment, as shown in FIG. 10B, the first via 31 includes a first via channel 311 and a second via channel 312 communicating with each other, and the first via channel 311 is located on a side of the second via channel 312 close to the base substrate 101; an orthographic projection of the first via channel 311 on the base substrate is overlapped with an orthographic projection of at least a portion of the second via channel 312 on the base substrate, and the orthographic projection of the first via channel 311 on the base substrate is not overlapped with an orthographic projection of the first sub-electrode 241 on the base substrate, for example, the orthographic projection of the first via channel 311 on the base substrate is not overlapped with orthographic projections of the first part of the first sub-electrode and the second part of the first sub-electrode of the first sub-electrode 241 on the base substrate respectively. The orthographic projection of the first via channel 311 on the base substrate is overlapped with an orthographic projection of at least a portion of the first active layer 22 on the base substrate 101 and exposes at least a portion of the first active layer 22; an orthographic projection of at least a portion of the via second channel 312 on the base substrate is overlapped with an orthographic projection of at least a portion of the first sub-electrode 241 on the base substrate, and at least a portion of the first sub-electrode 241 is exposed, for example, the orthographic projection of the second via channel 312 on the base substrate is overlapped with the orthographic projections of the first part of the first sub-electrode and the second part of the first sub-electrode of the first sub-electrode 241 on the base substrate respectively, and the first part of the first sub-electrode and the second part of the first sub-electrode of the first sub-electrode 241 are exposed. At least a portion of the second sub-electrode is electrically connected with the exposed first active layer 22 through the first via channel 311, and at least a portion of the second sub-electrode is electrically connected with the exposed first sub-electrode 241 through the second via channel 312.

In an exemplary embodiment, the orthographic projection of the first via channel 311 on the base substrate is located within the orthographic projection of the second via channel 312 on the base substrate, and an area of the orthographic projection of the first via channel 311 on the base substrate is smaller than an area of the orthographic projection of the second via channel 312 on the base substrate, enabling the second via channel 312 to completely cover the first via channel 311.

In an exemplary embodiment, as shown in FIG. 10A, a second via 32 is located between the second source-drain electrode 25 and the first active layer 22, an orthographic projection of the second via 32 is overlapped with the orthographic projection of the first active layer 22 on the base substrate 101, and the second via 32 exposes at least a portion of the first active layer 22. An orthographic projection of the second source-drain electrode 25 is overlapped with the orthographic projection of the second via 32 on the base substrate 101, and at least a portion of the second source-drain electrode 25 is electrically connected with the exposed first active layer 22 through the second via 32. Wherein, the second source-drain electrode 25 may serve as a source electrode of the first transistor.

In an exemplary embodiment, embodiments of the present disclosure show that the first transistor in the display substrate may be an oxide transistor, and the first active layer 22 in the first transistor may employ an oxide semiconductor, for example, the material of the first active layer 22 includes one of an indium gallium zinc oxide material and an indium tin zinc oxide material. The first transistor may be one of a top gate transistor, a bottom gate transistor, and a double gate transistor. For example, the first transistor may be a double gate transistor, thereby improving the on-state current of the first transistor and its uniformity as shown in FIG. 10A.

In an exemplary embodiment, as shown in FIG. 10A, the gate drive circuit includes at least one second transistor; the second transistor at least includes a second active layer 41, a third gate 42, a third source-drain electrode 43 and a fourth source-drain electrode 44 sequentially arranged on the base substrate 101, the third gate 42 is located on a side of the second active layer 41 away from the base substrate 101, and an orthographic projection of the third gate 42 is overlapped with an orthographic projection of the second active layer 41 on the base substrate 101.

In an exemplary embodiment, as shown in FIG. 10A, the drive circuit layer further includes at least one third via 33 and at least one fourth via 34.

In an exemplary embodiment, as shown in FIG. 10A, the third via 33 is located between the third source-drain electrode 43 and the second active layer 41, an orthographic projection of the third via 33 is overlapped with an orthographic projection of the second active layer 41 on the base substrate 101, and the third via 33 exposes at least a portion of the second active layer 41. An orthographic projection of the third source-drain electrode 43 is overlapped with the orthographic projection of the third via 33 on the base substrate 101, and at least a portion of the third source-drain electrode 43 is electrically connected with the exposed second active layer 41 through the third via 33. The third source-drain electrode 43 may serve as a source electrode of the second transistor.

In an exemplary embodiment, as shown in FIG. 10A, the fourth via 34 is located between the fourth source-drain electrode 44 and the second active layer 41, an orthographic projection of the fourth via 34 is overlapped with the orthographic projection of the second active layer 41 on the base substrate 101, and the fourth via 34 exposes at least a portion of the second active layer 41. An orthographic projection of the fourth source-drain electrode 44 is overlapped with the orthographic projection of the fourth via 34 on the base substrate 101, and at least a portion of the fourth source-drain electrode 44 is electrically connected with the exposed second active layer 41 through the fourth via 34. The fourth source drain electrode 44 may serve as a drain electrode of the second transistor.

Figure 10C:
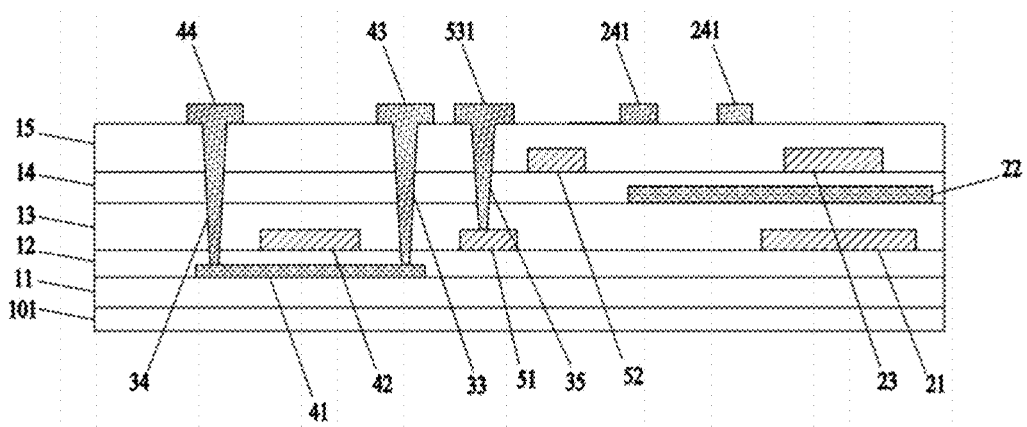
FIG. 10C is a schematic diagram of a display substrate obtained after a first semiconductor layer, a first conductive layer, a second semiconductor layer, a second conductive layer, a third via, a fourth via, and a fifth via are formed according to an embodiment of the present disclosure.

Hereinafter, an exemplary description will be given for a structure and a preparing process of a display substrate with reference to FIG. 10A to FIG. 10C.

The "patterning process" mentioned in the embodiments of the present disclosure includes processes, such as photoresist coating, mask exposure, development, etching and photoresist stripping for metal materials, inorganic materials or transparent conductive materials, and includes organic material coating, mask exposure and development for organic materials. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film formed by a material on a base substrate through deposition, coating, or other processes. If the "thin film" does not need a patterning process in an entire preparing process, the "thin film" may also be called a "layer". If the "thin film" needs a patterning process in an entire preparing process, it is called a "thin film" before the patterning process, and called a "layer" after the patterning process. The "layer" after the patterning process includes at least one "pattern".

In an exemplary implementation, the preparing process of the display substrate may include following acts:

(1) Providing a base substrate.

In an exemplary embodiment, the base substrate 101 may be a rigid base substrate or a flexible base substrate. For example, the rigid base substrate may be made of, but not limited to, one or more of glass and quartz. The flexible base substrate may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In some exemplary embodiments, the flexible base substrate may include a first flexible material layer, a first inorganic material layer, a semiconductor layer, a second flexible material layer and a second inorganic material layer which are stacked, wherein materials of the first flexible material layer and the second flexible material layer may be polyimide (PI), polyethylene terephthalate (PET) or a surface-treated polymer soft film, or the like; materials of the first inorganic material layer and the second inorganic material layer may be silicon nitride (SiNx) or silicon oxide (SiOx), etc., for improving the water-resistance and oxygen-resistance of the substrate; and the material of the semiconductor layer may be amorphous silicon (a-si).

(2) Forming a first semiconductor layer, a first conductive layer, a second semiconductor layer, a second conductive layer, a third via, a fourth via, and a fifth via.

In an exemplary embodiment, firstly, a first barrier layer 11, a first semiconductor layer, a first gate insulating layer 12, a first conductive layer, a first interlayer dielectric layer 13, a second semiconductor layer, a second gate insulating layer 14, a second conductive layer, and a second interlayer dielectric layer 15 are sequentially formed on a base substrate 101. Wherein, the first semiconductor layer includes a second active layer 41, the first conductive layer includes a third gate 42, a first gate 21 and a first connection electrode 51, and the first connection electrode 51 is electrically connected with the first gate 21; the second semiconductor layer includes a first active layer 22, the second conductive layer includes a second gate 23 and a second connection electrode 52, and the second connection electrode 52 is electrically connected with the second gate 23.

Then, a third via 33, a fourth via 34 and a fifth via 35 are formed through a first etching process. Wherein, both an orthographic projection of the third via 33 and an orthographic projection of the fourth via 34 are overlapped with the orthographic projection of the second active layer 41 on the base substrate 101, both the third via 33 and the fourth via 34 extend from a surface of the second interlayer dielectric layer 15 on a side away from the base substrate 101 along a direction close to the base substrate 101, passing through the second interlayer dielectric layer 15, the second gate insulating layer 14, the first interlayer dielectric layer 13, and the first gate insulating layer 12 sequentially, and extending to a surface of the second active layer 41 on a side away from the base substrate 101, and the third via 33 and the fourth via 34 each expose at least a portion of the second active layer 41. The fifth via 35 extends from a surface of the second interlayer dielectric layer 15 on a side away from the base substrate 101 along a direction close to the base substrate 101, passing through the second interlayer dielectric layer 15, the second gate insulating layer 14, and the first interlayer dielectric layer 13 sequentially, and extending to a surface of the first connection electrode 51 on a side away from the base substrate 101. The fifth via 35 exposes at least a portion of the first connection electrode 51.

Finally, a first conductive film is deposited on the second interlayer dielectric layer 15, and the first conductive film is patterned by a patterning process so that the first conductive film forms a third conductive layer. The third conductive layer includes a first sub-electrode 241, a third source-drain electrode 43, a fourth source-drain electrode 44, and a first connection sub-electrode 531, and the first sub-electrode 241 includes a first part of the first sub-electrode and a second part of the first sub-electrode separated from each other. The third source-drain electrode 43 is electrically connected with the exposed second active layer 41 through the third via 33, the fourth source-drain electrode 44 is electrically connected with the exposed second active layer 41 through the fourth via 34, and the first connection sub-electrode 531 is electrically connected with the exposed first connection electrode 51 through the fifth via 35, as shown in FIG. 10C.

(3) Forming a first via hole, a second via hole, a sixth via hole and a seventh via hole.

On the base substrate 101 on which the aforementioned pattern is formed, firstly, a third interlayer dielectric layer 16 is formed on the second interlayer dielectric layer 15, and the third interlayer dielectric layer 16 covers the first sub-electrode 241, the third source-drain electrode 43, the fourth source-drain electrode 44, and the first connection sub-electrode 531; then, the first via 31, the second via 32, the sixth via 36 and the seventh via 37 are formed through a second etching process, as shown in FIG. 10B.

In an exemplary embodiment, as shown in FIG. 10B, the first via 31 includes a first via channel 311 and a second via channel 312 communicating with each other, and the first via channel 311 is located on a side of the second via channel 312 close to the base substrate 101; an orthographic projection of the first via channels 311 on the base substrate is overlapped with an orthographic projection of at least a portion of the first active layer 22 on the base substrate 101, the first channel 311 extends from a surface of the second interlayer dielectric layer 15 on a side away from the base substrate 101 along a direction close to the base substrate 101, passing through the second interlayer dielectric layer 15 and the second gate insulating layer 14 sequentially, and extending to a surface of the first active layer 22 on a side away from the base substrate 101, and at least a portion of the first active layer 22 is exposed. An orthographic projection of the second via channel 312 is overlapped with the orthographic projection of the first via channel 311 on the base substrate, and the second via channel 312 penetrates the third interlayer dielectric layer 16 and is communicated with the first via channel 311.

In an exemplary embodiment, as shown in FIG. 10B, an orthographic projection of the second via 32 on the base substrate is overlapped with an orthographic projection of at least a portion of the first active layer 22 on the base substrate 101, the second via 32 extends from a surface of the third interlayer dielectric layer 16 on a side away from the base substrate 101 along a direction close to the base substrate 101, passing through the third interlayer dielectric layer 16, the second interlayer dielectric layer 15 and the second gate insulating layer 14 sequentially, and extending to a surface of the first active layer 22 on a side away from the base substrate 101, and at least a portion of the first active layer 22 is exposed.

In an exemplary embodiment, As shown in FIG. 10B, an orthographic projection of the sixth via 36 on the base substrate is overlapped with an orthographic projection of at least a portion of the second connection electrode 52 on the base substrate, the sixth via hole 36 extends from a surface of the third interlayer dielectric layer 16 on a side away from the base substrate 101 along a direction close to the base substrate 101, passing through the third interlayer dielectric layer 16 and the second interlayer dielectric layer 15 sequentially, and extending to a surface of the second connection electrode 52 on a side away from the base substrate 101, and at least a portion of the second connection electrode 52 is exposed.

In an exemplary embodiment, as shown in FIG. 10B, an orthographic projection of the seventh via 37 on the base substrate is overlapped with an orthographic projection of at least a portion of the first connection sub-electrode 531 on the base substrate, the seventh via 37 penetrates the third interlayer dielectric layer 16, and at least a portion of the first connection sub-electrode 531 is exposed.

(4) Forming a fourth conductive layer.

A second conductive thin film is deposited on the base substrate 101 on which the aforementioned patterns are formed, and the second conductive thin film is patterned through a patterning process to form a fourth conductive layer. The fourth conductive layer includes a second source-drain electrode 25, a second sub-electrode 242 and a second connection sub-electrode 532. The second source-drain electrode 25 is electrically connected with the first active layer 22 through a second via 32; the second connection sub-electrode 532 is electrically connected with the second connection electrode 52 through the sixth via 36; the second connection sub-electrode 532 is electrically connected with the first connection sub-electrode 531 through a seventh via 37; the second sub-electrode 242 is electrically connected with the first sub-electrode 241 and the first active layer 22 respectively through the first via 31, as shown in FIG. 10A.

Wherein, the first sub-electrode 241 and the second sub-electrode 242 form a first source-drain electrode; and the first connection sub-electrode 531 and the second connection sub-electrode 532 form a third connection electrode. The third connection electrode is electrically connected with the first connection electrode 51 and the second connection electrode 52 so that the first gate electrode 21 and the second gate electrode 22 are electrically connected with the third connection electrode through the first connection electrode 51, the second connection electrode 52.

Hereto, the drive circuit layer pattern is prepared on the base substrate. In some examples, the light emitting structure layer and the encapsulation structure layer may be sequentially prepared on the drive circuit layer after the drive circuit layer is prepared, and it will not be described repeatedly herein.

As can be seen from the structure and preparing process of the display substrate described above, in the base substrate of the embodiments of the present disclosure the first sub-electrode and the first active layer are exposed through the first via, and the second sub-electrode is electrically connected with the first sub-electrode and the first active layer respectively through the first via, so that the first via and other vias, such as the second via, can be prepared by a same preparing process, the preparing step of forming the first via is omitted, the preparing process of the display substrate is simplified, and the production cost is reduced.

Figure 12A:
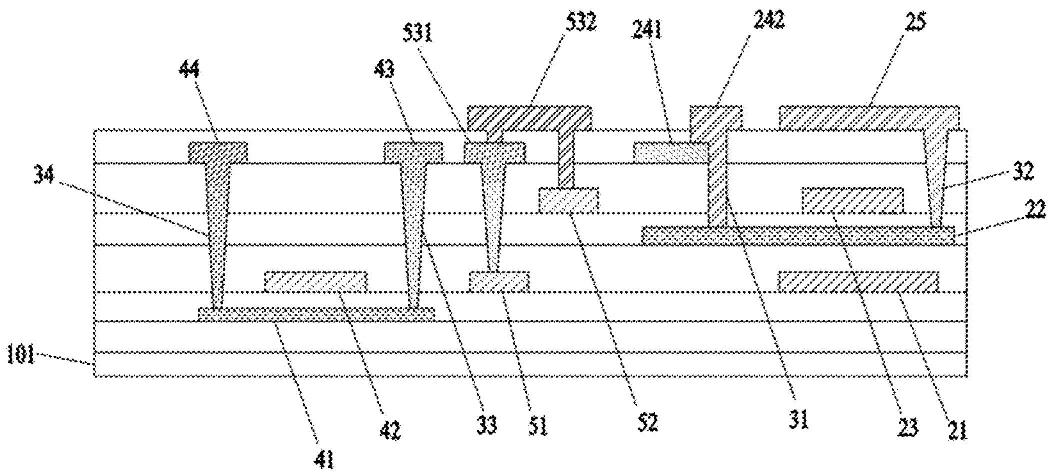
FIG. 12A is a second cross-sectional view of a display substrate according to an embodiment of the present disclosure.
Figure 12B:
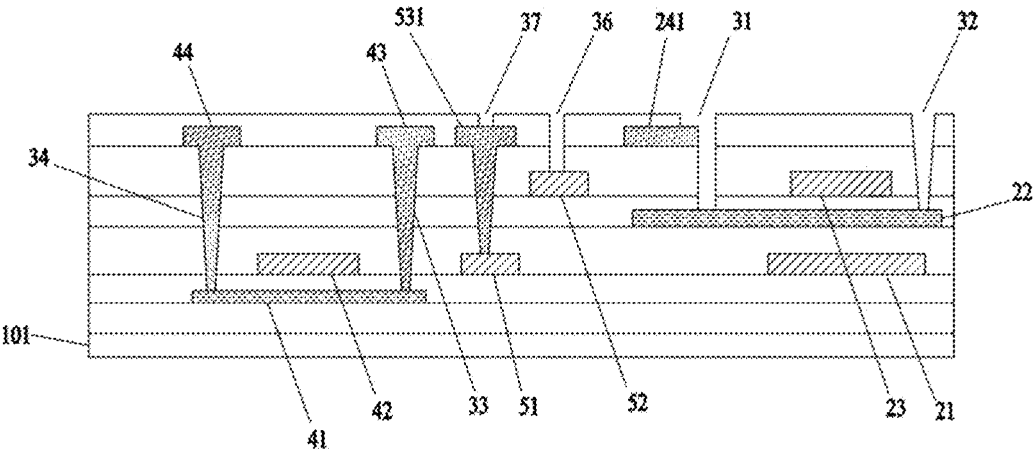
FIG. 12B is a second schematic diagram of a display substrate obtained after a first via is formed according to an embodiment of the present disclosure.

FIG. 12A is a second cross-sectional view of a display substrate according to an embodiment of the present disclosure; and FIG. 12B is a second schematic diagram of a display substrate obtained after a first via is formed according to an embodiment of the present disclosure. In an exemplary embodiment, as shown in FIG. 12A and FIG. 12B, in a direction perpendicular to the display substrate, the orthographic projection of the first via 31 of the display substrate of an embodiment of the present disclosure is overlapped with both the orthographic projection of the first sub-electrode 241 and the orthographic projection of the first active layer 22 on the base substrate 101, the first via 31 exposes at least a portion of the first sub-electrode 241, and the first via 31 exposes at least a portion of the first active layer 22. The orthographic projection of second sub-electrode 242 on the base substrate 101 is overlapped with the orthographic projection of the first via 31 on the base substrate 101. The second sub-electrode 242 is electrically connected with the exposed first sub-electrode 241 through the first via 31, and the second sub-electrode 242 is electrically connected with the exposed first active layer 22 through the first via 31, so that the first source-drain electrode formed by the first sub-electrode 241 and the second sub-electrode 242 is electrically connected with the first active layer 22.

Figure 12C:
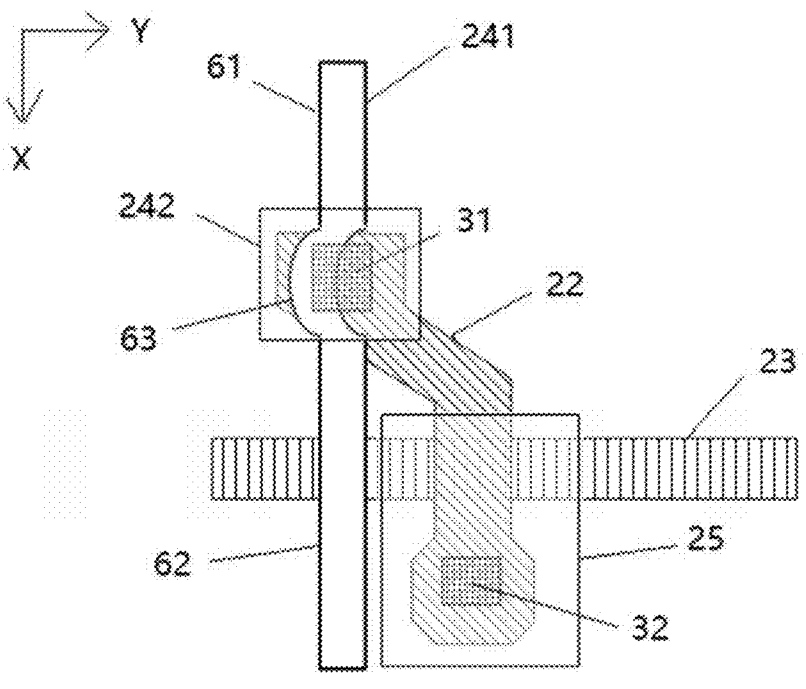
FIG. 12C is a second top view of a first crystal in a display substrate according to an embodiment of the present disclosure.
Figure 12D:
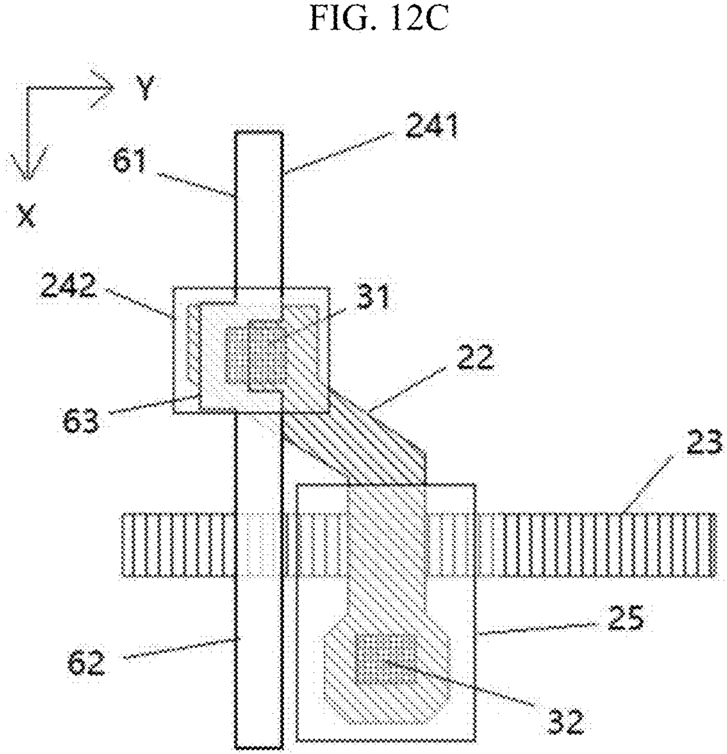
FIG. 12D is a third top view of a first crystal in a display substrate according to an embodiment of the present disclosure.

FIG. 12C is a second top view of a first crystal in a display substrate according to an embodiment of the present disclosure; and FIG. 12D is a third top view of a first crystal in a display substrate according to an embodiment of the present disclosure. In an exemplary embodiment, as shown in FIG. 12C and FIG. 12D, the first sub-electrode 241 includes a first part of the first sub-electrode 61, a second part of the first sub-electrode 62, and a third part of the first sub-electrode 63 connecting the first part of the first sub-electrode 61 and the second part of the first sub-electrode 62; and the first part of the first sub-electrode 61, the third part of the first sub-electrode 63, and the second part of the first sub-electrode 62 are sequentially connected along the first direction X. Both the first part of the first sub-electrode 61 and the second part of the first sub-electrode 62 extend along the first direction, and both an orthographic projection of the first part of the first sub-electrode 61 and an orthographic projection of the second part of the first sub-electrode 62 are linear on the base substrate 101. The orthographic projection of the first via 31 on the base substrate is not overlapped with the orthographic projection of the first part of the first sub-electrode 61 and the orthographic projection of the second part of the first sub-electrode 62 on the base substrate respectively.

In an exemplary embodiment, as shown in FIG. 12C and FIG. 12D, the third part of the first sub-electrode 63 is bent along a second direction Y; an orthographic projection of at least a portion of the first via 31 on the base substrate is overlapped with an orthographic projection of the third part of the first sub-electrode 63 on the base substrate, the first via 31 exposes at least a portion of the third part of the first sub-electrode 63, and the first via 31 exposes the first sub-electrode 241 by exposing the third part of the first sub-electrode 63. Wherein, the first direction X is different from the second direction Y, for example, the first direction X is perpendicular to the second direction Y.

According to the display substrate of an embodiment of the present disclosure, the first part of the first sub-electrode 61 and the second part of the first sub-electrode 62 are connected through the third part of the first sub-electrode 63, so that the first sub-electrode 241 is not disconnected, thus ensuring the integrity of the first sub-electrode 241, thereby reducing the transmission resistance of the first sub-electrode 241 and improving the performance of the first transistor.

In an exemplary embodiment, the curved shape of the third part of the first sub-electrode 63 along the second direction Y may take various shapes. For example, the curved shape of the third part of the first sub-electrode 63 may include a circular arc as shown in FIG. 12C; alternatively, the curved shape of the third part of the first sub-electrode 63 may include a U shape as shown in FIG. 12D. In some embodiments, the curved shape of the third part of the first sub-electrode 63 may include a regular or irregular shape, such as a polygon, for example, a pentagon, a hexagon or the like.

In an exemplary embodiment, a length of the third part of the first sub-electrode 63 in the second direction Y may be the same as a length of the first part of the first sub-electrode 61 and/or the second part of the first sub-electrode 62 in the second direction Y.

Figure 13:
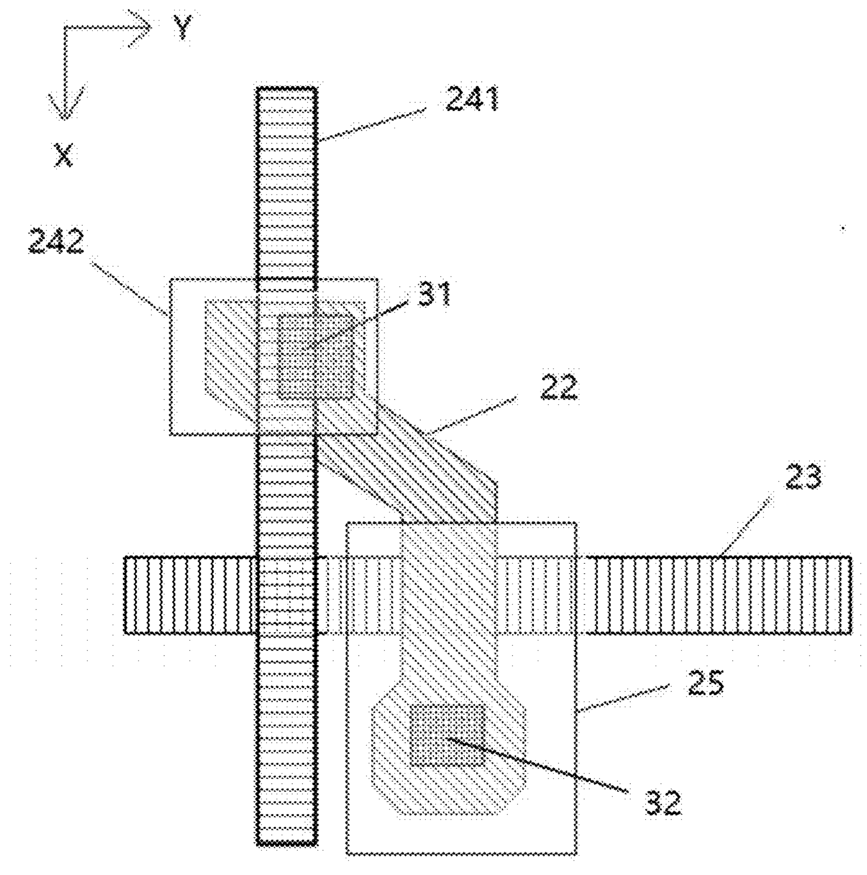
FIG. 13 is a third top view of a first crystal in a display substrate according to an embodiment of the present disclosure.

FIG. 13 is a third top view of a first crystal in a display substrate according to an embodiment of the present disclosure. In an exemplary embodiment, as shown in FIG. 13, the first sub-electrode 241 extends along the first direction X, and the orthographic projection of the first sub-electrode 241 on the base substrate 101 is linear. An orthographic projection of at least a portion of the first via 31 on the base substrate is overlapped with an orthographic projection of the first sub-electrode 241 on the base substrate, and the first via 31 exposes at least a portion of the first sub-electrode 241.

Figure 14A:
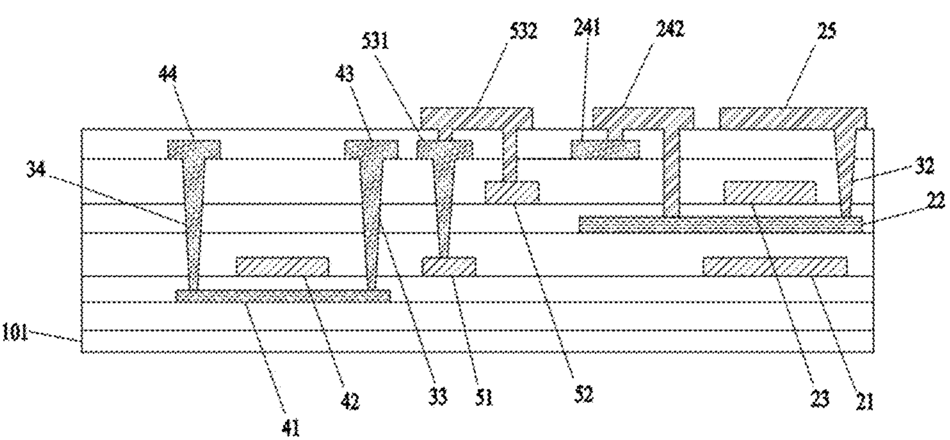
FIG. 14A is a third cross-sectional view of a display substrate according to an embodiment of the present disclosure.
Figure 14B:
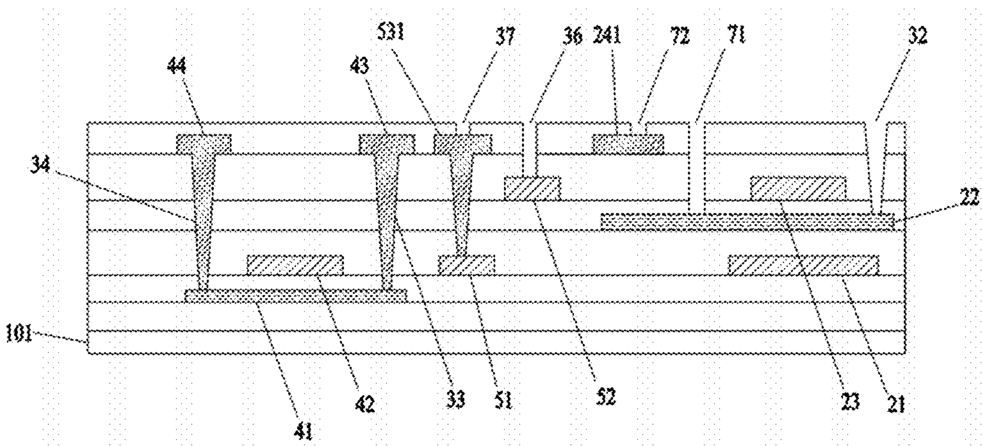
FIG. 14B is a third schematic diagram of a display substrate obtained after a first via is formed according to an embodiment of the present disclosure.

FIG. 14A is a third cross-sectional view of a display substrate according to an embodiment of the present disclosure; and FIG. 14B is a third schematic diagram of a display substrate obtained after a first via is formed according to an embodiment of the present disclosure. In an exemplary embodiment, as shown in FIG. 14A and FIG. 14B, in a direction perpendicular to the display substrate, the orthographic projection of the first via in the display substrate of an embodiment of the present disclosure is overlapped with both the orthographic projection of the first sub-electrode 241 and the orthographic projection of the first active layer 22 on the base substrate 101. The first via includes a first via channel 71 and a second via channel 72 which are independent of each other, and the first via channel 71 is located on the circumferential side of the second via channel 72; an orthographic projection of the first via channel 71 on the base substrate is overlapped with an orthographic projection of at least a portion of the first active layer 22 on the base substrate and exposes at least a portion of the first active layer 22, and the orthographic projection of the first via channel 71 on the base substrate is not overlapped with an orthographic projection of the first sub-electrode 241 on the base substrate. An orthographic projection of the second via channel 72 on the base substrate is overlapped with an orthographic projection of at least a portion of the first sub-electrode 241 on the base substrate and exposes at least a portion of the first sub-electrode 241; wherein the first via channel 71 and the second via channel 72 may be prepared by a same preparing process, thereby simplifying the process and reducing the production cost.

As shown in FIG. 14A, an embodiment of the present disclosure shows that the second sub-electrode 242 in the display substrate is electrically connected with the exposed first active layer 22 through the first channel 71, and the second sub-electrode 242 is electrically connected with the exposed first sub-electrode 241 through the second channel 72.

Figure 14C:
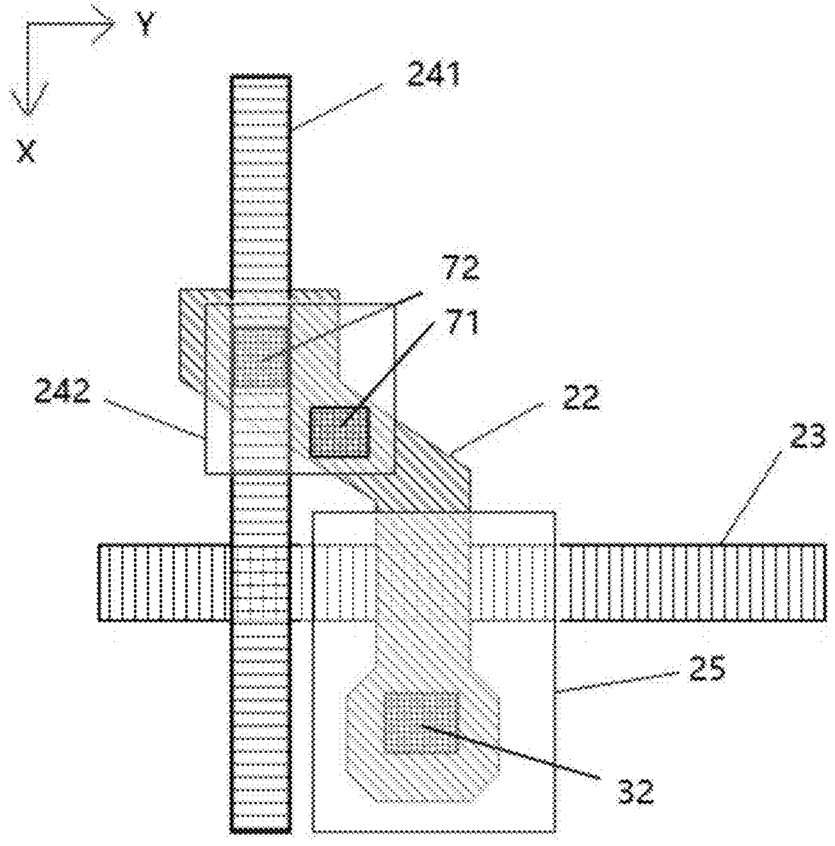
FIG. 14C is a fourth top view of a first crystal in a display substrate according to an embodiment of the present disclosure.

FIG. 14C is a fourth top view of a first crystal in a display substrate according to an embodiment of the present disclosure. In an exemplary embodiment, as shown in FIG. 14C, the first sub-electrode 241 extends along the first direction and the orthographic projection of the first sub-electrode 241 on the base substrate 101 is linear. An orthographic projection of at least a portion of the first channel 71 on the base substrate is overlapped with the orthographic projection of the first active layer 22 on the base substrate, and the first channel 71 exposes at least a portion of the first active layer 22; an orthographic projection of at least a portion of the second channel 72 on the base substrate is overlapped with the orthographic projection of the first sub-electrode 241 on the base substrate, and the second channel 72 exposes at least a portion of the first sub-electrode 241.

Figure 15:
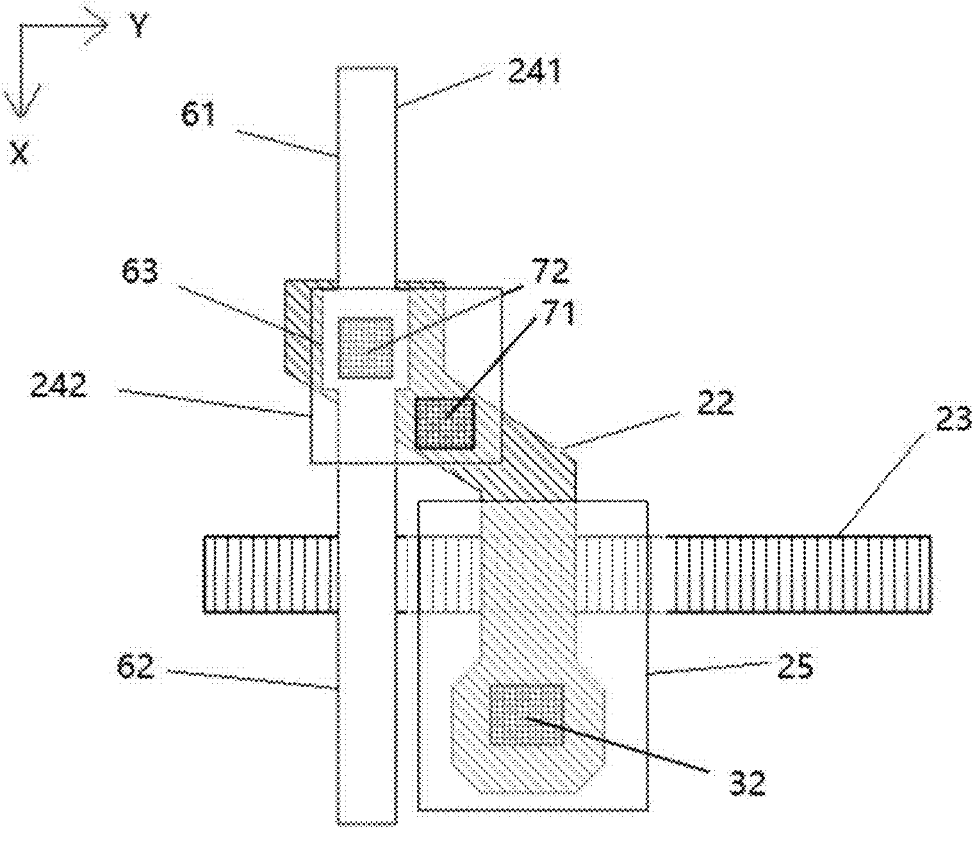
FIG. 15 is a fifth top view of a first crystal in a display substrate according to an embodiment of the present disclosure.

FIG. 15 is a fifth top view of a first crystal in a display substrate according to an embodiment of the present disclosure. In an exemplary embodiment, as shown in FIG. 15, the first via 31 includes a first via channel 71 and a second via channel 72 which are independent of each other, an orthographic projection of the first via channel 71 on the base substrate is overlapped with an orthographic projection of at least a portion of the first active layer 22 on the base substrate and exposes at least a portion of the first active layer 22, and an orthographic projection of the second via channel 72 on the base substrate is overlapped with an orthographic projection of at least a portion of the first sub-electrode 241 on the base substrate and exposes at least a portion of the first sub-electrode 241. The second sub-electrode 242 is electrically connected with the exposed first active layer 22 through the first via channel 71, and the second sub-electrode 242 is electrically connected with the exposed first sub-electrode 241 through the second via channel 72.

In an exemplary embodiment, as shown in FIG. 15, the first sub-electrode 241 includes a first part of the first sub-electrode 61, a second part of the first sub-electrode 62, and a third part of the first sub-electrode 63 connecting the first part of the first sub-electrode 61 and the second part of the first sub-electrode 62; and the first part of the first sub-electrode 61, the third part of the first sub-electrode 63, and the second part of the first sub-electrode 62 are sequentially connected along the first direction X. The first part of the first sub-electrode 61, the third part of the first sub-electrode 63, and the second part of the first sub-electrode 62 all extend along the first direction, and an orthographic projection of the first part of the first sub-electrode 61, an orthographic projection of the third part of the first sub-electrode 63, and an orthographic projection of the second part of the first sub-electrode 62 on the base substrate 101 all are linear. The orthographic projection of the second via channel 72 on the base substrate is not overlapped with the orthographic projection of the first part of the first sub-electrode 61 and the orthographic projection of the second part of the first sub-electrode 62 on the base substrate, the orthographic projection of the second via channel 72 on the base substrate is overlapped with the orthographic projection of at least a portion of the third part of the first sub-electrode 63, and the second via channel 72 exposes at least a portion of the third part of the first sub-electrode 63.

In an exemplary embodiment, as shown in FIG. 15, the third part of the first sub-electrode 63 has a first edge and a second edge arranged opposite to each other in the second direction Y, the first part of the first sub-electrode 61 has a third edge and a fourth edge arranged opposite to each other in the second direction Y, the second sub-electrode portion 62 has a fifth edge and a sixth edge arranged opposite to each other in the second direction, a first distance from the first edge of the third part of the first sub-electrode 63 to the second edge of the third part of the first sub-electrode 63 is larger than a second distance from the third edge of the first part of the first sub-electrode 61 to the fourth edge of the first part of the first sub-electrode 61, so that the first edge and the second edge of the third part of the first sub-electrode 63 protrude from the third edge and the fourth edge of the first part of the first sub-electrode 61 along the second direction Y; and/or, the first distance from the first edge of the third part of the first sub-electrode 63 to the second edge of the third part of the first sub-electrode 63 is greater than a third distance from the fifth edge of the second part of the first sub-electrode 62 to the sixth edge of the second part of the first sub-electrode 62, so that the first edge and the second edge of the third part of the first sub-electrode 63 protrude from the fifth edge and the sixth edge of the second part of the first sub-electrode 62 along the second direction Y. Wherein, the first distance, the second distance and the third distance are all the distances in the second direction Y.

The display substrate of the embodiment of the present disclosure shows that the first distance from the first edge to the second edge of the third part of the first sub-electrode 63 is increased to ensure that an area of the third part of the first sub-electrode 63 is exposed by the second via channel 72, thereby increasing the contact area between the second sub-electrode 242 and the first sub-electrode 241 through the first via 31 and reducing the contact resistance between the second sub-electrode 242 and the first sub-electrode 241.

Figure 16A:
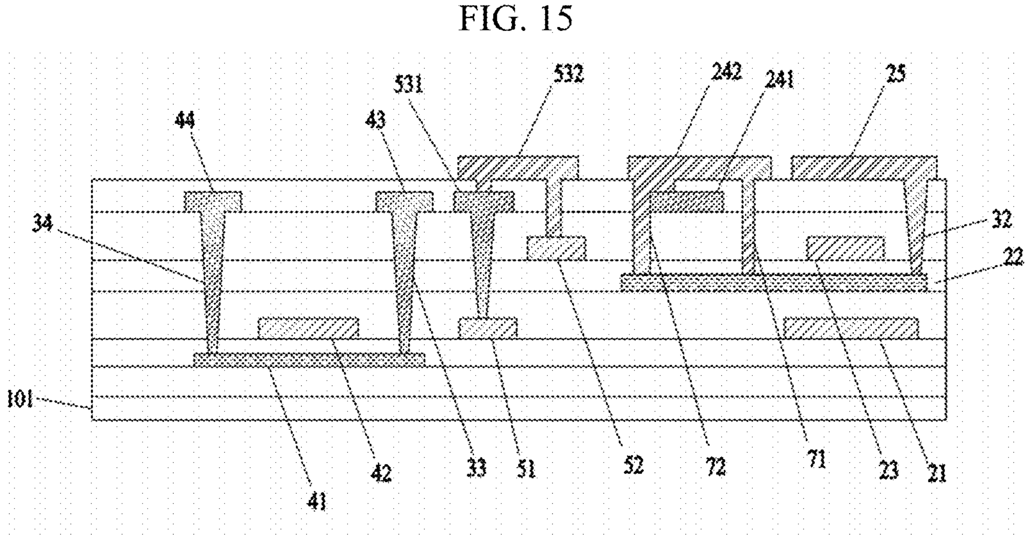
FIG. 16A is a fourth cross-sectional view of a display substrate according to an embodiment of the present disclosure.
Figure 16B:
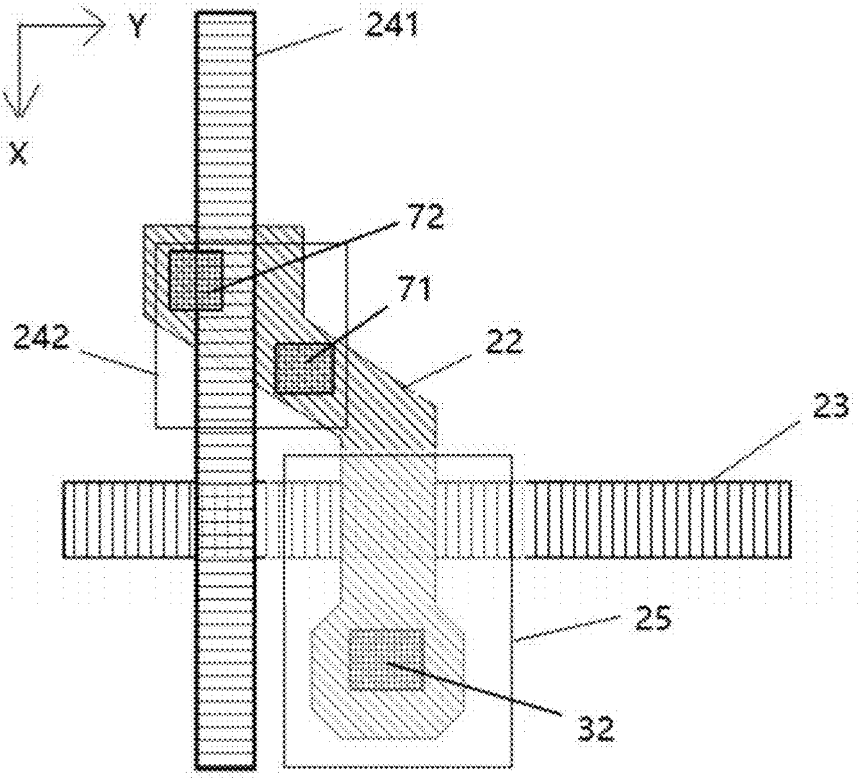
FIG. 16B is a sixth top view of a first crystal in a display substrate according to an embodiment of the present disclosure.

FIG. 16A is a fourth cross-sectional view of a display substrate according to an embodiment of the present disclosure, and FIG. 16B is a sixth top view of a first crystal in a display substrate according to an embodiment of the present disclosure. As shown in FIG. 16A and FIG. 16B, the first via 31 includes a first via channel 71 and a second via channel 72 which are independent of each other, an orthographic projection of the first via channel 71 on the base substrate is overlapped with an orthographic projection of at least a portion of the first active layer 22 on the base substrate, and at least a portion of the first active layer 22 is exposed, an orthographic projection of the second via channel 72 is overlapped with an orthographic projection of at least a portion of the first active layer 22 and an orthographic projection of at least a portion of the first sub-electrode 241 on the base substrate, respectively, and the second via channel 72 exposes at least a portion of the first active layer 22 and at least a portion of the first sub-electrode 241. The second sub-electrode 242 is electrically connected with the exposed first active layer 22 through the first channel 71, and the second sub-electrode 242 is electrically connected with the exposed first active layer 22 and the exposed first sub-electrode 241 through the second channel 72.

In an exemplary embodiment, as shown in FIG. 16A, the second via channel 72 includes a first sub-via channel and a second sub-via channel which are communicated with each other, and the first sub-via channel is located on a side of the second sub-via channel close to the base substrate; an orthographic projection of the first sub-via channel on the base substrate is overlapped with an orthographic projection of at least a portion of the second sub-via channel on the base substrate, the orthographic projection of the first sub-via channel on the base substrate is not overlapped with the orthographic projection of the first sub-via electrode 241 on the base substrate, the orthographic projection of the first sub-via channel on the base substrate is overlapped with an orthographic projection of at least a portion of the first active layer 22 on the base substrate, and the first sub-via channel exposes at least a portion of the first active layer 22; an orthographic projection of at least a portion of the second sub-via channel on the base substrate is overlapped with an orthographic projection of at least a portion of the first sub-electrode 241 on the base substrate, and the second sub-via channel exposes at least a portion of the first sub-electrode 241; the second sub-electrode 242 is electrically connected with the exposed first active layer 22 through the first sub-channel, and at least a portion of the second sub-electrode 241 is electrically connected with the exposed first sub-electrode 241 through the second sub-via channel, so that the second sub-electrode 241 is electrically connected with the first active layer 22 and the first sub-electrode 241 through the second channel 72, respectively.

In an exemplary embodiment, the orthographic projection of the first sub-via channel on the base substrate is located within the orthographic projection of the second sub-via channel on the base substrate, and an area of the orthographic projection of the first sub-via channel on the base substrate is smaller than an area of the orthographic projection of the second sub-via channel on the base substrate.

The present embodiment further provides a preparing method for a display substrate, which is used for preparing the display substrate described above, wherein the preparing method includes:

forming a first active layer on the base substrate;

forming a first sub-electrode on the first active layer;

forming a first via on the base substrate, so that the first via exposes at least a portion of the first sub-electrode and at least a portion of the first active layer, respectively;

forming a second sub-electrode on the first sub-electrode, so that the second sub-electrode is electrically connected with the exposed first sub-electrode through the first via, and so that the second sub-electrode is electrically connected with the exposed first active layer through the first via.

In an exemplary embodiment, forming a first sub-electrode on the first active layer includes:

forming a first conductive layer on the first active layer;

patterning the first conductive layer, so that the first conductive layer forms a first part of the first sub-electrode and a second part of the first sub-electrode which are separated from each other;

allowing at least a portion of the first part of the first sub-electrode and at least a portion of the second part of the first sub-electrode to be respectively exposed by the first via, and allowing the second sub-electrode to be electrically connected with the exposed first part of the first sub-electrode and the exposed second part of the first sub-electrode through the first via.

In an exemplary embodiment, forming a first sub-electrode on the first active layer includes:

forming a first conductive layer on the first active layer;

patterning the first conductive layer, allowing the first conductive layer to form a first part of the first sub-electrode, a second part of the first sub-electrode, and a third part of the first sub-electrode connecting the first part of the first sub-electrode and the second part of the first sub-electrode, the first part of the first sub-electrode and the second part of the first sub-electrode extends in the first direction, and the third part of the first sub-electrode bends in the second direction;

allowing at least a portion of the third part of the first sub-electrode to be exposed by the first via, and the second sub-electrode to be electrically connected with the exposed third part of the first sub-electrode through the first via, wherein the first direction is different from the second direction.

In an exemplary embodiment, forming a first sub-electrode on the first active layer includes:

forming a first conductive layer on the first active layer;

patterning the first conductive layer, allowing the first conductive layer to form a first sub-electrode, and allowing an orthographic projection of the first sub-electrode on the base substrate to be linear;

allowing the first via to expose at least a portion of the first sub-electrode, and the second sub-electrode to be electrically connected with the exposed first sub-electrode through the first via.

In an exemplary embodiment, forming a first via on a base substrate includes:

forming a first via channel and a second via channel which are independent of each other on the base substrate;

allowing the first via channel to expose at least a portion of the first active layer, and allowing an orthographic projection of the first via channel on the base substrate to be not overlapped with the orthographic projection of the first sub-electrode on the base substrate;

allowing the second via channel to expose at least a portion of the first sub-electrode;

allowing the second sub-electrode to be electrically connected with the exposed first active layer through the first via channel, and allowing the second sub-electrode to be electrically connected with the exposed first sub-electrode through the second via channel.

In an exemplary embodiment, forming a second via channel on a base substrate includes:

forming a first sub-via channel on a base substrate, allowing the first sub-via channel to expose at least a portion of the first sub-electrode, and allowing an orthographic projection of the first sub-via channel on the base substrate to be not overlapped with the orthographic projection of the first sub-electrode on the base substrate;

forming a second sub-via channel at a side of the first sub-via channel away from the base substrate, allowing the second sub-via channel to be communicated with the first sub-via channel;

allowing the second sub-electrode to be electrically connected with the exposed first active layer through the first sub-via channel, and allowing the second sub-electrode to be electrically connected with the exposed first sub-electrode through the second sub-via channel.

In an exemplary embodiment, forming a first sub-electrode on the first active layer includes:

forming a first conductive layer on the first active layer;

patterning the first conductive layer, allowing the first conductive layer to form a first part of the first sub-electrode, a second part of the first sub-electrode, and a third part of the first sub-electrode connecting the first part of the first sub-electrode and the second part of the first sub-electrode, and the first part of the first sub-electrode, the second part of the first sub-electrode, and the third part of the first sub-electrode extends in the first direction;

the third part of the first sub-electrode has a first edge and a second edge arranged opposite to each other in the second direction, the first part of the first sub-electrode has a third edge and a fourth edge arranged opposite to each other in the second direction, and the second part of the first sub-electrode has a fifth edge and a sixth edge arranged opposite to each other in the second direction, allowing a distance from the first edge to the second edge to be greater than a distance from the third edge to the fourth edge; and/or allowing the distance from the first edge to the second edge to be greater than a distance from the fifth edge to the sixth edge;

allowing at least a portion of the third part of the first sub-electrode to be exposed by the first via, and the second sub-electrode is electrically connected with the exposed third part of the first sub-electrode through the first via.

For the method for manufacturing the display substrate in the present embodiment, reference may be made to descriptions of the aforementioned embodiments, and thus will not be repeated here.

The present embodiment further provides a display apparatus including the display substrate as described above.

In some exemplary implementations, the display substrate may be a flexible OLED display substrate, a QLED display substrate, a Micro-LED display substrate or a Mini-LED display substrate. The display apparatus may be any product or component with a display function such as an OLED display, a cell phone, a tablet, a television, a display, a laptop, a digital photo frame, a navigator, and so on, which is not limited in the embodiments of the present disclosure.

Although the implementations disclosed in the present disclosure are described as above, the described contents are only implementations which are used for facilitating the understanding of the present disclosure, but are not intended to limit the present invention. Any skilled person in the art to which the present disclosure pertains may make any modifications and variations in forms and details of implementation without departing from the spirit and scope of the present disclosure. However, the patent protection scope of the present invention should be subject to the scope defined by the appended claims.

The invention claimed is:

1. A display substrate, comprising:

a base substrate and a driving circuit layer arranged on the base substrate, wherein:

the driving circuit layer comprises a pixel circuit, the pixel circuit comprises a first transistor;

the first transistor at least comprises: a first active layer and a first source-drain electrode and a second source-drain electrode arranged on the base substrate, wherein the first source-drain electrode comprises a first sub-electrode and a second sub-electrode, and the second sub-electrode is located at a side of the first sub-electrode away from the base substrate;

the first transistor further comprises a first gate and a second gate, wherein the second gate extends in a second direction, the second direction is perpendicular to a first direction the driving circuit layer further comprises a first via hole, the first via hole is filled by the second sub-electrode, an orthographic projection of the first via hole is overlapped with an orthographic projection of the first sub-electrode and is overlapped with an orthographic projection of the first active layer on the base substrate and the second sub-electrode is electrically connected with the exposed first active layer through the first via hole;

the first source-drain electrode is a drain electrode of the first transistor, the second source-drain electrode is a source electrode of the first transistor, the second sub-electrode of the first source-drain electrode is arranged at a same layer as the second source-drain electrode, and the first sub-electrode of the first source-drain electrode is arranged at a different layer than the second source-drain electrode;

the first sub-electrode comprises a first part of the first sub-electrode and a second part of the first sub-electrode, the first part of the first sub-electrode and the second part of the first sub-electrode each extend in the first direction;

the first via comprises a first via channel and a second via channel communicating with each other, and the first via channel is located on a side of the second via channel close to the base substrate; the second via channel exposes at least a portion of the first part of the first sub-electrode and at least a portion of the second part of the first sub-electrode, and the second sub-electrode is electrically connected with each of the exposed portion of the first part of the first sub-electrode and the exposed portion of the second part of the first sub-electrode through the second via channel;

the first active layer, the second gate and the first sub-electrode are arranged sequentially in a direction perpendicular to the base substrate;

an orthographic projection of the first via channel on the base substrate is smaller than an orthographic projection of the second via channel on the base substrate and overlapped with a portion of the orthographic projection of the second via channel on the base substrate, the orthographic projection of the first via channel on the base substrate is not overlapped with an orthographic projection of the first part of the first sub-electrode on the base substrate and an orthographic projection of the second part of the first sub-electrode on the base substrate, and the orthographic projection of the second via channel on the base substrate is overlapped with the orthographic projection of the first part of the first sub-electrode on the base substrate and the orthographic projection of the second part of the first sub-electrode on the base substrate; and the first part of the first sub-electrode and the second part of the first sub-electrode are located at two sides of the first via channel in the first direction and are spaced apart from each other by the first via channel in the first direction.

2. The display substrate according to claim 1, wherein the driving circuit layer further comprises a gate insulating layer, a first interlayer dielectric layer and a second interlayer dielectric layer sequentially arranged on the base substrate, the gate insulating layer and the first interlayer dielectric layer are located between the first active layer and the first sub-electrode, the second interlayer dielectric layer is located on a side of the first sub-electrode away from the base substrate, and the first via hole passes through the second interlayer dielectric layer, the first interlayer dielectric layer and the gate insulating layer and extends to a surface of the first active layer on a side away from the substrate.

3. The display substrate according to claim 1, wherein the second source-drain electrode is located on a side of the first active layer away from the base substrate, the driving circuit layer further comprises a second via hole, and the second source-drain electrode is electrically connected with the first active layer through the second via hole.

4. The display substrate according to claim 1, wherein the first gate is located on a side of the first active layer close to the base substrate, the second gate is located on a side of the first active layer away from the base substrate, and an orthographic projection of the first gate on the base substrate, an orthographic projection of the second gate on the base substrate and the orthographic projection of the first active layer on the base substrate are overlapped.

5. The display substrate according to claim 1, wherein a material of the first active layer comprises one of an indium gallium zinc oxide material and an indium tin zinc oxide material.

6. The display substrate according to claim 1, wherein the pixel circuit comprises a second transistor; the second transistor comprises a second active layer, a third gate, a third source-drain electrode and a fourth source-drain electrode arranged on the base substrate, an orthographic projection of the second active layer on the base substrate is overlapped with an orthographic projection of the third gate on the base substrate, the third source-drain electrode and the fourth source-drain electrode are each electrically connected with the second active layer, and a material of the second active layer comprises low-temperature polysilicon.

7. A display apparatus, comprising the display substrate according to claim 1.

8. A preparing method for a display substrate comprising: forming a driving circuit layer on a base substrate, wherein:

the driving circuit layer comprises a pixel circuit, the pixel circuit comprises a first transistor;

the first transistor at least comprises: a first active layer and a first source-drain electrode and a second source-drain electrode arranged on the base substrate, wherein the first source-drain electrode comprises a first sub-electrode and a second sub-electrode, and the second sub-electrode is located at a side of the first sub-electrode away from the base substrate;

the first transistor further comprises a first gate and a second gate, wherein the second gate extends in a second direction, the second direction is perpendicular to a first direction the driving circuit layer further comprises a first via hole, the first via hole is filled by the second sub-electrode, an orthographic projection of the first via hole is overlapped with an orthographic projection of the first sub-electrode and is overlapped with an orthographic projection of the first active layer on the base substrate and the second sub-electrode is electrically connected with the exposed first active layer through the first via hole;

the first source-drain electrode is a drain electrode of the first transistor, the second source-drain electrode is a source electrode of the first transistor, the second sub-electrode of the first source-drain electrode is arranged at a same layer as the second source-drain electrode, and the first sub-electrode of the first source-drain electrode is arranged at a different layer than the second source-drain electrode;

the first sub-electrode comprises a first part of the first sub-electrode and a second part of the first sub-electrode, the first part of the first sub-electrode and the second part of the first sub-electrode each extend in the first direction;

the first via comprises a first via channel and a second via channel communicating with each other, and the first via channel is located on a side of the second via channel close to the base substrate;

the second via channel exposes at least a portion of the first part of the first sub-electrode and at least a portion of the second part of the first sub-electrode, and the second sub-electrode is electrically connected with each of the exposed portion of the first part of the first sub-electrode and the exposed portion of the second part of the first sub-electrode through the second via channel;

the first active layer, the second gate and the first sub-electrode are arranged sequentially in a direction perpendicular to the base substrate;

an orthographic projection of the first via channel on the base substrate is smaller than an orthographic projection of the second via channel on the base substrate and overlapped with a portion of the orthographic projection of the second via channel on the base substrate, the orthographic projection of the first via channel on the base substrate is not overlapped with an orthographic projection of the first part of the first sub-electrode on the base substrate and an orthographic projection of the second part of the first sub-electrode on the base substrate, and the orthographic projection of the second via channel on the base substrate is overlapped with the orthographic projection of the first part of the first sub-electrode on the base substrate and the orthographic projection of the second part of the first sub-electrode on the base substrate; and the first part of the first sub-electrode and the second part of the first sub-electrode are located at two sides of the first via channel in the first direction and are spaced apart from each other by the first via channel.

* * * * *